United States Patent
Wu

(10) Patent No.: US 7,495,283 B2
(45) Date of Patent: Feb. 24, 2009

(54) NOR-TYPE CHANNEL-PROGRAM CHANNEL-ERASE CONTACTLESS FLASH MEMORY ON SOI

(76) Inventor: Koucheng Wu, 8F, No. 492, Rong-An First Street, Jhongli City, Taoyuan County (TW) 32071

( * ) Notice: Subject to any disclaimer, the term of this patent is extended or adjusted under 35 U.S.C. 154(b) by 205 days.

(21) Appl. No.: 11/193,653

(22) Filed: Aug. 1, 2005

(65) Prior Publication Data

US 2006/0018164 A1    Jan. 26, 2006

Related U.S. Application Data

(62) Division of application No. 10/781,112, filed on Feb. 18, 2004, now Pat. No. 7,042,044.

(51) Int. Cl.
*H01L 29/788*  (2006.01)
(52) U.S. Cl. ............... 257/316; 257/318; 257/E27.103; 257/E27.112; 365/185.24; 365/185.18
(58) Field of Classification Search .................. 257/316
See application file for complete search history.

(56) References Cited

U.S. PATENT DOCUMENTS

| 5,796,142 A | 8/1998 | Lin et al. |
| 5,885,868 A | 3/1999 | Lin et al. |
| 5,995,412 A | 11/1999 | Ohta |
| 6,226,198 B1 | 5/2001 | Miwa et al. |
| 6,438,030 B1 | 8/2002 | Hu et al. |
| 6,498,752 B1 * | 12/2002 | Hsu et al. ............... 365/185.22 |

OTHER PUBLICATIONS

D. Burnett, et al., "An Advanved Flash Memory Technology on SOI", IEDM Tech. Digest, pp. 983-986, 1998.
K. S. Kim, et. al., "A Novel Dual String NOR (DuSNOR) Memory Cell Technology Scalable to the 256 Mbit and 1 Gbit Flash Memories", IEDM Tech. Digest, pp. 263-266, 1995.
Y. Yamauchi, et al., "A New Cell Structure for Sub-quarter Micron High Density Flash Memory", IEDM Tech. Digest, pp. 267-270, 1995.
S. Aritome, et al., "A Reliable Bi-polarity Write/Erase Technology in Flash EEPROMs", IEDM Tech. Digest, pp. 111-114, 1990.

* cited by examiner

*Primary Examiner*—Tu-Tu V Ho

(57) ABSTRACT

A semiconductor device having an electrically erasable programmable read only memory (EEPROM) comprises a contactless array of EEPROM memory cells disposed in rows and columns and constructed over a silicon-on-insulator wafer. Each EEPROM memory cell comprises a drain region, a source region, a gate region, and a body region. The semiconductor device further comprises a plurality of gate lines each connecting the gate regions of a row of EEPROM memory cells, a plurality of body lines each connecting the body regions of a column of EEPROM memory cells, a plurality of source lines each connecting the source regions of a column of EEPROM memory cells, and a plurality of drain lines each connecting the drain regions of a column of EEPROM memory cells. The source lines and the drain lines are buried lines, and the source regions and the drain regions of a column of EEPROM memory cells are insulated from the source regions and the drain regions of the adjacent columns of EEPROM memory cells.

6 Claims, 20 Drawing Sheets

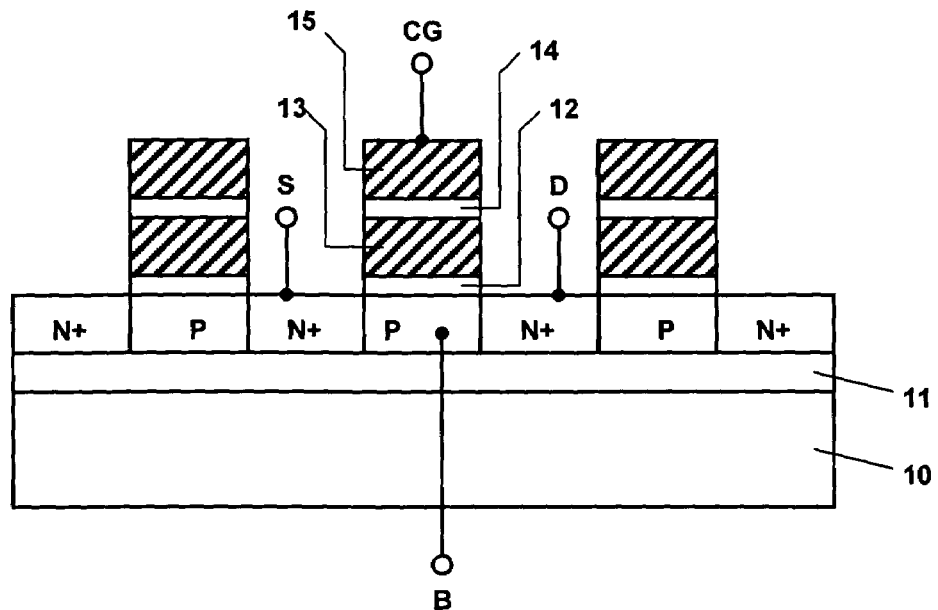
FIG. 1 *(Prior Art)*
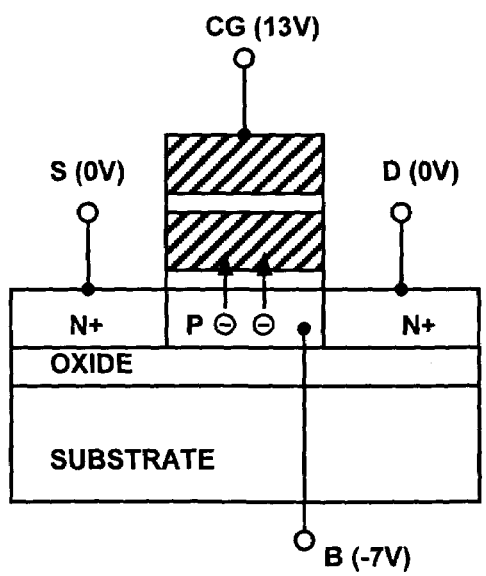
FIG. 3a *(Prior Art)*
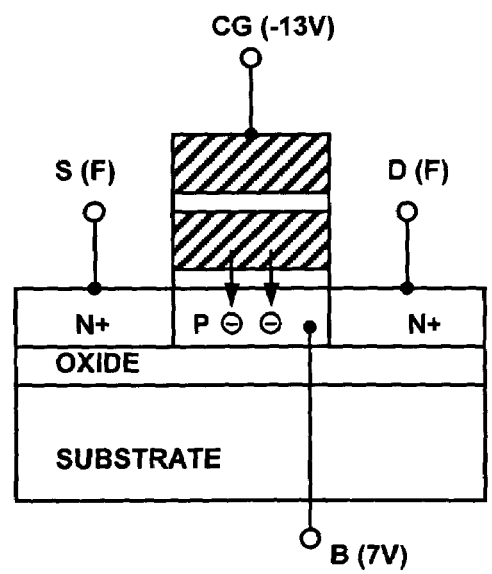
FIG. 3b *(Prior Art)*

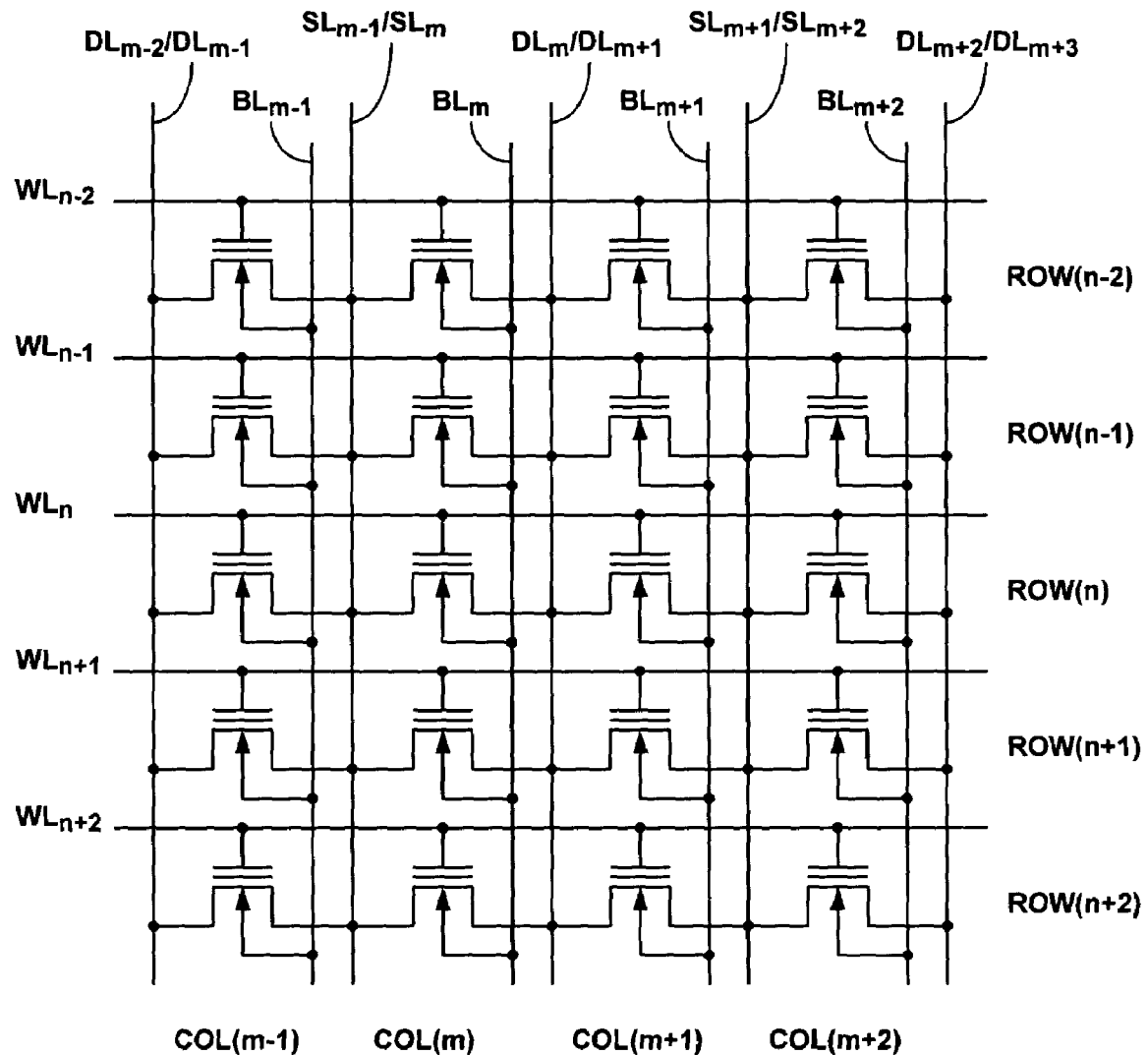
FIG. 2 *(Prior Art)*

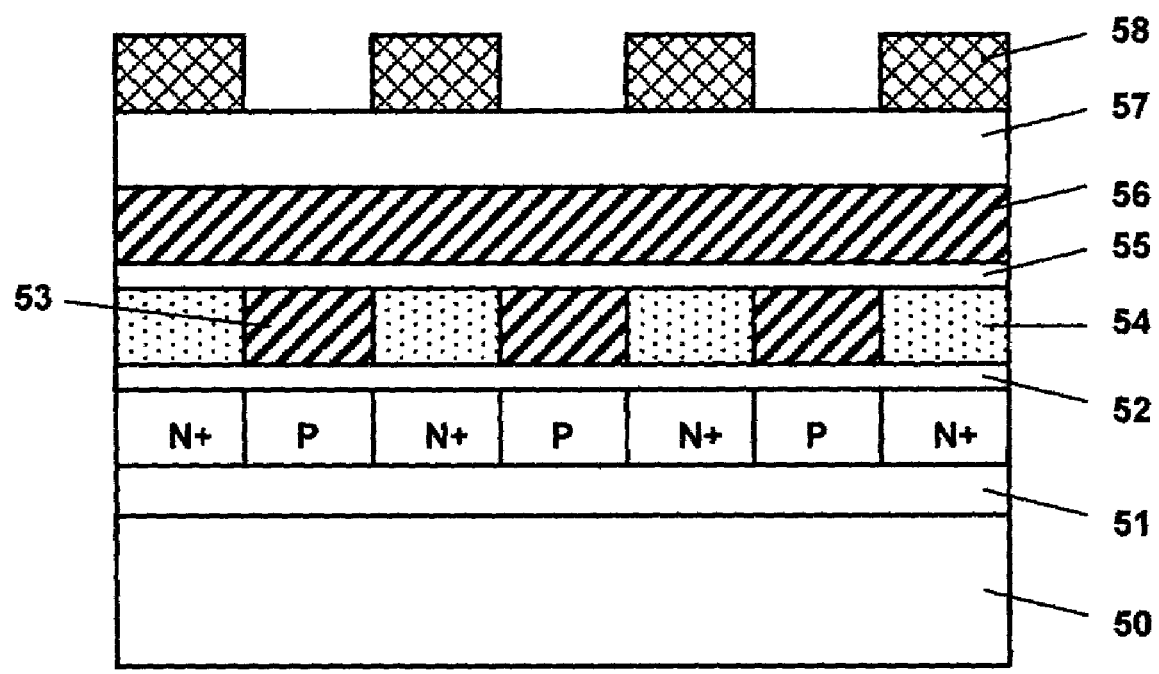
FIG. 5a *(Prior Art)*
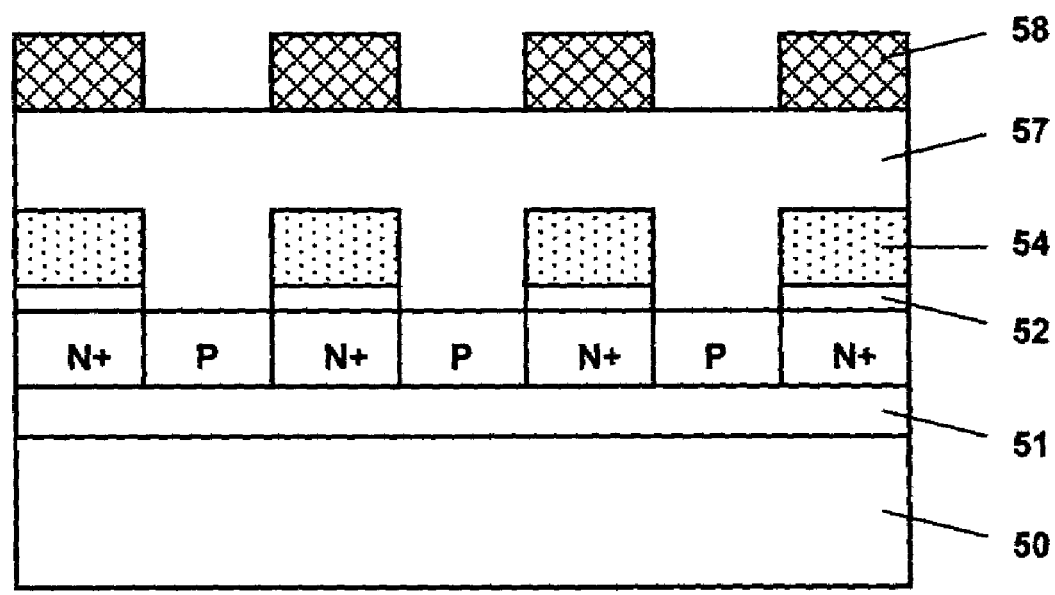
FIG. 5b *(Prior Art)*

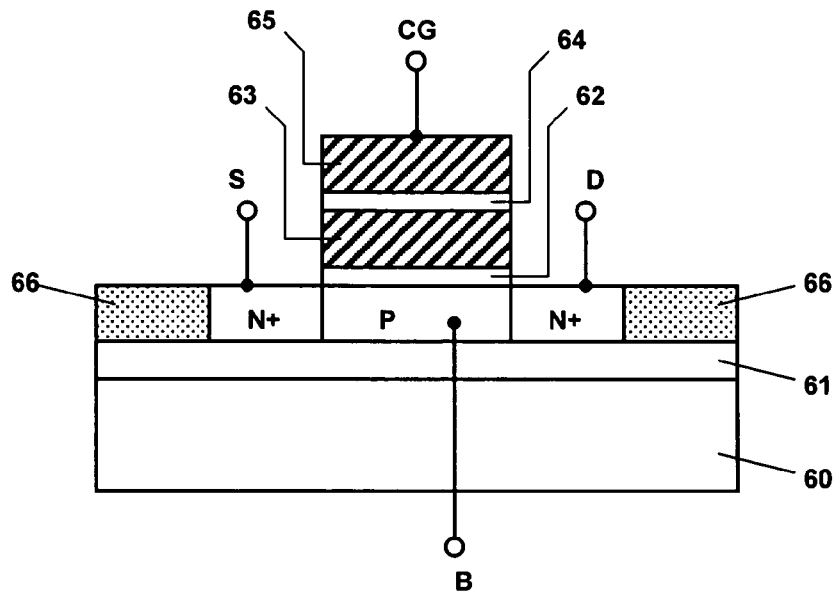
FIG. 6
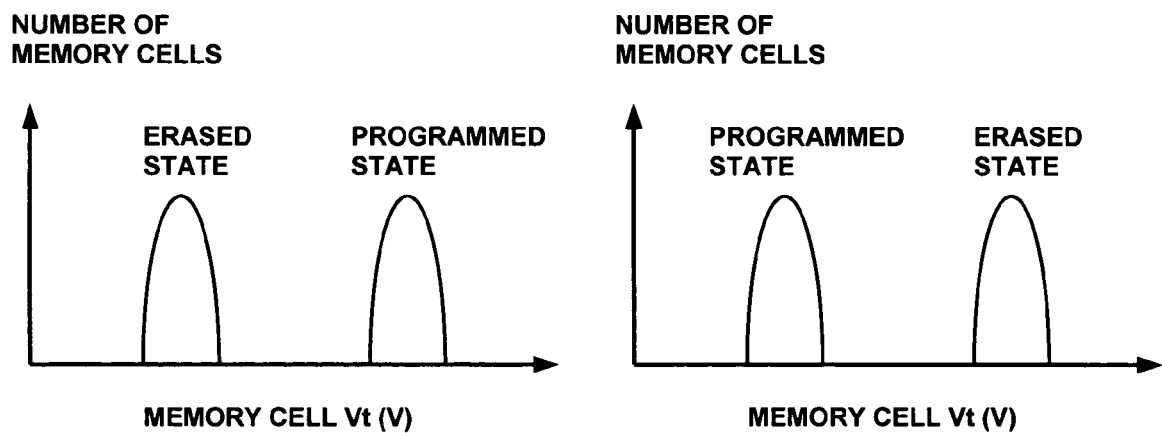
FIG. 8a  FIG. 8b

NOR-TYPE CHANNEL-PROGRAM CHANNEL-ERASE CONTACTLESS FLASH MEMORY ON SOI

RELATED APPLICATIONS

This application is a divisional patent application of the U.S. patent application Ser. No. 10/781,112, filed on Feb. 18, 2004, titled "NOR-Type Channel-Program Channel-Erase Contactless Flash Memory on SOI", the content of which is hereby incorporated by reference.

TECHNICAL FIELD

The present invention relates in general to a nonvolatile semiconductor memory having an electric programmable/erasable function. In particular, the present invention relates to contactless memory arrays on Silicon-On-Insulator (SOI) for flash electrically erasable programmable read-only memory (EEPROM) devices.

BACKGROUND OF THE INVENTION

There are a widespread variety of flash memories with different cell structures, program/erase methods, and array organizations. Flash memories can be classified into two groups based on their program/erase methods: (1) employing channel hot electron (CHE) injection for programming and employing Fowler-Nordheim (FN) tunneling for erasing; and (2) employing Fowler-Nordheim (FN) tunneling for both programming and erasing.

Method (1) is the most common method for flash memories, and particularly for ETOX (EPROM Tunnel Oxide) type flash memories. The CHE program consumes more than 300 µA per cell, hence only a few bits can be programmed at a time by an on-chip charge pump. To improve the hot electron generation efficiency, the drain junction needs to be an abrupt junction, and sometimes covered by a p+ region to enhance the impact ionization.

The FN tunneling can be divided into source/drain edge FN tunneling and channel FN tunneling. The edge FN tunneling is to extract electrons from the floating gate (FG) by applying a negative voltage (e.g. −10 V) to the control gate (CG) and a positive voltage (e.g. 5 V) to the source or drain junction. The source or drain junction needs to be a lighter and deeper junction to (a) sustain a high voltage without breakdown, (b) reduce the band-to-band tunneling (BBT) current, (c) reduce the hot hole injection, and (d) increase the overlap area with the floating gate. The edge FN tunneling consumes about 10 nA per cell, which is mostly constituted of the substrate leakage current due to the band-to-band tunneling.

All the memory cells relying on the edge effects (such as edge program and edge erase) require process optimization on the source/drain junctions to enhance the program/erase efficiencies. Such process optimization normally results in asymmetric source/drain junctions, which adds more complexity to the manufacturing process. Moreover, the endurance characteristics of the memory cells employing the edge program and/or edge erase are deteriorated with repeated program/erase cycles due to the trapped electron and/or holes in the tunnel oxide.

The FN tunneling via the channel region consumes the least current, in the order of 10 pA per cell, among all program and erase mechanisms. Therefore, a large number of flash cells can be programmed and erased simultaneously by the on-chip charge pumps, which can be also smaller than the charge pumps used for edge program and edge erase. The memory cell employing uniform channel program and channel erase also shows the least deterioration in the endurance characteristics because the trapped carriers are neutralized by the alternative electric fields. Since the memory cell does not rely on the source/drain edge in program or erase, the source/drain junctions can be symmetric, which help to simplify the fabrication process.

The physical dimensions of CMOS devices will be continuously scaled down in the future semiconductor technologies. The device dimensions of memory cells also need to be scaled down in the future flash memory technologies. Many of the challenges for bulk CMOS devices can be relaxed if the devices are fabricated on silicon-on insulator (SOI) wafers. A SOI flash memory technology has been proposed in U.S. Pat. Nos. 5,796,142 and 5,885,868 to achieve the goals of high density and low power consumption. The memory cell employs channel program and channel erase, which consume very low currents. The memory cell has a symmetric device structure. The memory cells are arranged in a NOR-type contactless flash memory array. Every two adjacent columns share the source/drain line in between. There is no field oxide within a memory array. The memory cell size (about $4\,F^2$) is indeed very small, only about one third of a typical ETOX cell size (about $12\,F^2$).

Detailed disclosures in U.S. Pat. Nos. 5,796,142 and 5,885,868 are now discussed. FIG. 1 schematically shows the flash memory cell structure of U.S. Pat. Nos. 5,796,142 and 5,885,868. The memory cells are fabricated on a SOI wafer, which consists of a silicon substrate 10, an oxide layer 11, and a p-type doped silicon thin film. Each of the memory cell transistor is constituted of a tunnel oxide film 12, a first polysilicon (poly-1) floating gate 13, an oxide-nitride-oxide (ONO) insulating film 14, and a second polysilicon (poly-2) control gate (CG) 15. The n+ source/drain are formed by arsenic implantation into the p-type silicon thin film after the poly-1 floating gate 13 is patterned. The n+ source/drain is shared between two adjacent cells.

FIG. 2 is a circuit diagram showing the memory array portion of the flash memory device disclosed in U.S. Pat. Nos. 5,796,142 and 5,885,868. The source lines and the drain lines are shared between two adjacent columns. The body line (e.g. $BL_m$) of each column is isolated from the body lines (e.g. $BL_{m-1}$ and $BL_{m+1}$) of adjacent columns by the n+ source/drain lines and the oxide layer 11 beneath the p-type body.

Memory cell program, erase, and read bias configurations are summarized in TABLE 1. Both program and erase cell operations are accomplished by the Fowler-Nordheim (FN) tunneling effect between the floating gate and the body. It is known that the FN tunneling current is much smaller than the hot-electron injection (HEI) current by orders of magnitude. FIG. 3*a* shows the cross section view of the program operation of a memory cell. To program a memory cell, a positive high voltage (e.g. 13 V) is applied to the word line and a negative high voltage (e.g. −7 V) is applied to the body line. According to the descriptions of the prior art, the memory cell is programmed by charging up the floating gate. The floating gate potential is coupled to the control gate voltage and the body voltage through the CG-to-FG and body-to-FG coupling coefficients. A voltage difference is therefore created between the floating gate and the body. Electrons are injected from the transistor body to the floating gate through the tunnel oxide by the Fowler-Nordheim tunneling effect. According to the suggested programming condition, the breakdown voltage of the source/drain-to-body junctions needs to be larger than 7 V. Such a large breakdown voltage imposes a serious limitation to scale down the physical dimensions of the memory cell for the future technologies.

TABLE 1

|    | Program | Erase    | Read |
|----|---------|----------|------|
| WL | 13 V    | −13 V    | Vdd  |
| BL | −7 V    | 7 V      | 0 V  |
| SL | 0 V     | Floating | 0 V  |
| DL | 0 V     | Floating | 1 V  |

However, an inversion layer is formed in the semiconductor surface when a positive high voltage is applied to the control gate in the program operation. In fact, channel regions are formed in all the memory cells along the selected word line. All the channel regions are connected because adjacent memory cells share the source/drain lines in between. The source/drain voltage is 0 V for the selected and unselected memory cells in the program operation. All the channel potentials are the same, i.e. 0V, for both selected and unselected memory cells along the selected word line. U.S. Pat. Nos. 5,796,142 and 5,885,868 therefore cannot properly perform the program operation. The inversion layer shields the body potential from the floating gate. The body potential has no effect in programming the cell. The formation of inversion layers in the program operation is not taken into consideration in U.S. Pat. Nos. 5,796,142 and 5,885,868.

FIG. 3b shows the cross section view of the erase operation of a memory cell. To erase a memory cell, a negative high voltage (e.g. −13 V) is applied to the word line and a positive high voltage (e.g. 7 V) is applied to the body line. The source and drain are floating. The floating source and drain will be charged up by the positively biased p-type body. Because the control gate is negatively biased, the semiconductor surface is in the accumulation region. The floating gate potential is coupled to the control gate voltage and the body voltage through the CG-to-FG and body-to-FG coupling coefficients. A voltage difference is therefore created across the tunnel oxide. Electrons are removing from the floating gate to the transistor body through the tunnel oxide by the Fowler-Nordheim tunneling effect.

FIG. 4 is a layout plan view showing the memory array portion of the U.S. Pat. Nos. 5,796,142 and 5,885,868 of the prior art. The field oxide 40 provides the device isolation between two adjacent memory array blocks, and between the memory array block and outside peripheral circuitry. There is no field oxide inside the memory array block. The poly-1 layer 41 defines the p-type body regions. The n+ source/drain area 42 is implanted after patterning the poly-1 41. The poly-2 layer 43 defines the word lines. The intersection of the poly-1 layer 41 and the poly-2 layer 43 defines the floating gate 46. The n+ contact 44 provided an electric contact to the n+ source/drain area. The body contact 45 provided an electric contact to the p-type body area. The size of the unit cell 47 is very small, which is about 4 $F^2$ where F is the minimum geometry feature. The small memory cell size is achieved because adjacent memory cell columns share the source/drain line in between and there is no field oxide inside the memory array block.

FIG. 5a is the cross-sectional view taken along line 4A-4A' of FIG. 4. FIG. 5b is a cross-sectional view taken along line 4B-4B' of FIG. 4. The starting material is a p-type SOI wafer, which consists of a p-type doped silicon thin film, an oxide layer 51, and a silicon substrate 50. A layer of tunnel oxide layer 52 is grown on the SOI wafer, after which a first polysilicon layer 53 is deposited and patterned, followed by arsenic implantation to form the n+ source/drain lines. A first boron phosphosilicate glass (BPSG) layer 54 is deposited, followed by reflow and etch back. An ONO layer 55 is formed. A second polysilicon layer 56 is then deposited. Stacked gates are formed by removing the unwanted poly-2 56, ONO 55, and poly-1 53 layers. A second BPSG layer 57 is then deposited to cover the stack gates. Contact openings for the source/drain lines 42, body lines 41, and word lines 43 are formed. Metal lines 58 leading to the contact openings are formed for connecting the memory cells with peripheral circuits.

For the device structure in FIG. 5a, the floating gate has the same coupling areas to the control gate and to the body, but the effective oxide thickness of the ONO layer 55 is thicker than the thickness of the tunnel oxide 52. The CG-to-FG coupling ratio is below 50%, which is smaller than the coupling ratios of most NOR-type flash technologies. The program/erase voltages must be high enough to compensate the low CG-to-FG coupling ratio. The coupling ratio of a typical ETOX flash memory cell is about 65%. The floating gate usually extends beyond the active area, which is called FG wing, to increase the coupling ratio.

The original goal of the U.S. Pat. Nos. 5,796,142 and 5,885,868 was to provide a solution to the low-power and high-density flash memory. The cell program/erase (P/E) operations are uniform FN channel program and uniform FN channel erase. The cell size is impressively small, i.e. 4 $F^2$, which is about one third of the cell size of a typical ETOX memory cell (about 12 $F^2$). Unfortunately, the flash memory device in U.S. Pat. Nos. 5,796,142 and 5,885,868 do not work as it is intended to because the inversion layer is induced in the programming phase. In addition, the prior art device also undesirably requires large breakdown voltage of source/drain-to-body junctions and large program/erase voltages due to the low CG-to-FG coupling ratio.

SUMMARY OF INVENTION

In one aspect, the present invention provides a semiconductor device having an electrically erasable programmable read only memory (EEPROM), comprising a contactless array of EEPROM memory cells disposed in rows and columns and constructed over a silicon-on-insulator wafer, each EEPROM memory cell comprising a drain region, a source region, a gate region, and a body region;

a plurality of gate lines each connecting the gate regions of a row of EEPROM memory cells;

a plurality of body lines each connecting the body regions of a column of EEPROM memory cells;

a plurality of source lines each connecting the source regions of a column of EEPROM memory cells; and a plurality of drain lines each connecting the drain regions of a column of EEPROM memory cells;

wherein the source lines and the drain lines are buried lines, and the source regions and the drain regions of a column of EEPROM memory cells are insulated from the source regions and the drain regions of the adjacent columns of EEPROM memory cells.

In another aspect, the present invention provides semiconductor device having an electrically erasable programmable read only memory (EEPROM), comprising a contactless array of EEPROM memory cells disposed in rows and columns and constructed over a silicon-on-insulator wafer, each EEPROM memory cell comprising a drain region, a source region, a gate region, and a body region;

a plurality of gate lines each connecting the gate regions of a row of EEPROM memory cells;

a plurality of source lines each connecting the source regions and the body regions of a column of EEPROM memory cells; and a plurality of drain lines each connecting the drain regions of a column of EEPROM memory cells;

wherein the source lines and the drain lines are buried lines; and the source regions and the drain regions of a column of EEPROM memory cells are insulated from the source regions and the drain regions of the adjacent columns of EEPROM memory cells.

In yet another aspect, the present invention provides a method for correcting out-of-range threshold voltages of EEPROM memory cells in a semiconductor device, comprising specifying a tolerance range for the threshold voltage of each memory state for the EEPROM memory cells;

detecting at least one out-of-range threshold voltage in the EEPROM memory cells;

applying a positive voltage pulse to the gate region if the detected out-of-range threshold voltage is below the specified tolerance range; and applying a negative voltage pulse to the gate region if the detected out-of-range threshold voltage is above the specified tolerance range.

The present invention provides a NOR-type contactless flash memory array on silicon-on-insulator (SOI) for high-density small-geometry flash memories. In the present invention, the term "contactless" refers to a EEPROM memory cell that does not have exposed electric contact at source or drain regions in the unit cell. The physical dimensions of CMOS devices will be continuously scaled down in the future silicon technologies. SOI technologies have demonstrated superior scaling capability over bulk silicon technologies. For example, drain-induced barrier lowering (DIBL) and short-channel effects are reduced in SOI devices. The circuit performance can be improved by 30% or the power consumption can be reduced by 60% if the circuits are fabricated on SOI wafers. Many of the challenges for CMOS devices in bulk silicon are relaxed if the devices are fabricated on SOI wafers. Thin-body SOI holds the promise to be the future technology/device choice beyond the scaling limit of bulk CMOS. The device dimensions of flash memory cells are required to be scaled down at the same rate of logic CMOS devices. It is a natural decision to implement flash memories on SOI for the future flash memory products.

In another aspect, the present invention provides program and erase schemes using Fowler-Nordheim (FN) tunneling effect through the channel region of a memory cell. Such program/erase operations are able to provide the following benefits.

a) The channel FN program and channel FN erase consume very little currents, in the order of 10 pA per cell. Therefore, a large number of flash cells can be programmed and erased simultaneously by on-chip charge pumps of economic area, or the charge pump areas can be relatively small compared to other program and erase mechanisms. Small program/erase currents are also favorable in the future small geometry technologies, since the power supply voltage is continuously scaled down.

b) The memory cells employing channel FN program and channel FN erase show the least deterioration in the endurance characteristics because the trapped carriers are neutralized by the alternative electric fields. The data retention time is one order of magnitude longer than that of traditional ETOX cells, which is programmed by channel hot electron (CHE) injection and erased by FN tunneling. The improvement in data retentivity is due to decreasing the gate oxide leakage current by bi-polarity FN tunneling stress.

c) The memory cell transistor has symmetric source/drain junctions. The carrier injection and extraction are performed via the tunnel oxide in the channel region. Neither carrier injection nor carrier extraction is performed near the source or drain junction edge. The memory cell therefore can be a symmetric device. The symmetric device structure helps to simplify the fabrication process and reduce the manufacturing cost.

In yet another aspect, the present invention eliminates the high breakdown voltage requirements on the source/drain junctions. For most flash memories other than the present invention, at least one of the source/drain junctions is required to sustain a high breakdown voltage (such as 7 V) in the program or erase operation. The high junction breakdown voltage requirement imposes a serious limitation to scale down flash memory cells in the future small geometry technologies. For the present invention, due to its unique program/erase operation and SOI cell structure, the source-to-body and drain-to-body voltages are zero in the program and erase operations. The source/drain junctions are not required to sustain any voltage higher than the read condition. The source/drain junctions of a memory cell in the present invention are therefore can be symmetric low-voltage junctions with abrupt doping profiles. The source/drain junctions can be created by the same process as the source/drain junctions of low-voltage logic transistors.

The present invention provides a scalable flash memory cell structure for future high-density flash memory applications. The cell size of present invention is about 8 $F^2$ (x-pitch is about 4 F and y-pitch is about 2 F), where F is the minimum geometry feature. This cell size is about two thirds of the cell size of a typical ETOX flash memory cell. ETOX is the most popular NOR-type flash memory today and ETOX is generally considered as the industry standard for the NOR-type flash memory. There are other NOR-type flash memory cells with even smaller cell sizes being reported in literature such as Dual String NOR (DuSNOR) flash memory with a cell size of 6.4 $F^2$ ("A Novel Dual String NOR Memory Cell Technology Scalable to the 256 Mbit and 1 Gbit Flash Memories", IEDM Tech. Digest, pp. 263-266, 1995) and ACT (Asymmetrical Contactless Transistor) flash memory with a cell size of 4.3 $F^2$ ("A New Cell Structure for Sub-quarter Micron High Density Flash Memory", IEDM Tech. Digest, pp. 267-270, 1995). The above three flash memory cells (ETOX, DuSNOR, and ACT) other than the present invention employ either channel hot-electron (CHE) programming or Fowler-Nordheim (FN) tunneling at the drain edges to program the memory cells. All the cell structures (other than the present invention) require the drain junctions to sustain high breakdown voltages. The cell transistors usually become asymmetric structures because of different requirements for the source and drain junctions. Moreover, for the FN edge programming, the drain junction requires enough overlap with the floating gate. The memory cell transistor of the present invention has symmetric source/drain junctions. The S/D-to-body voltages are always zero in the FN channel program and FN channel erase operations. The source/drain junctions are not required to sustain any voltage higher than the read condition. The source/drain junctions can be low-voltage junctions with abrupt doping profiles. The present invention has better scalability than other NOR-type flash memories due to its symmetric cell structure and low-voltage S/D junctions.

In another aspect, the present invention provides a high-speed MLC programming method capable of concurrently executing a program operation of multi-value data into a plurality of memory cells. The growing demand of storage capacity has driven the development of high-density flash memories with multiple-bit storage. The multi-level cell (MLC) technology increases the storage capacity by enabling the storage of multiple bits of data per memory cell and lowers the cost by reducing the consumption of silicon area. The high-speed programming method is called parallel MLC programming because multi-value data can be programmed to the memory cells on the same row in parallel. In the present invention, the cell Vt can be programmed to either a higher value or a lower value by FN channel programming. When the cell Vt is programmed to a higher value, parallel MLC programming can be implemented by simultaneously applying different specified voltages based on the input multilevel data to the drain lines or the source lines, while the word line voltage is fixed. Because a channel region is formed when the word line is positively biased, the channel potential can be supplied from either the drain line or the source line. When the cell Vt is programmed to a lower value, parallel MLC programming can be implemented by simultaneously applying different specified voltages to the body lines (or the source lines if the source lines are connected to the body lines) based on the input multilevel data, while the word line voltage is fixed. Because the semiconductor surface is in the accumulation region when the word line is negatively biased, the surface potential is supplied from the body line. The parallel MLC programming method therefore enable to shorten the programming time and reduce the gate disturb.

In accordance to the present invention, a word line is electrically connected to a plurality of gate regions in a row of EEPROM memory cells. The word line can also be referred to as gate line in the present invention.

In yet another aspect, the present invention provides a bit-by-bit Vt correction method to tighten the Vt distributions by bringing the out-of-range Vt back into the correct Vt range. The Vt distributions of flash memory cells become gradually broadened as the subsequent program, erase, and read operations are repeatedly executed. The Vt variations can be caused by the charge gain and charge loss in the mechanisms of program/erase/read disturbs, charge trapped in tunnel oxide, and data retention issues. This phenomenon of Vt variation significantly limits the program/erase endurance cycles of nonvolatile semiconductor memories. The memory cell structure and array architecture of the present invention allow the cell Vt to be trimmed up and down on the bit-by-bit basis. The present invention offers different program operations, which enable flexible Vt fine-tune strategies to tighten the Vt distributions. The Vt correction operation starts with a sensing operation to identify the cells with out-of-range Vt. If high-Vt cells are identified, program pulses (ProgDn) are applied to the high-Vt cells to trim down their Vt. For MLC cells, different voltages are simultaneously applied to the body lines of high-Vt cells while the word line voltage is fixed, which is similar to the parallel MLC programming. If low-Vt cells are identified, program pulses (ProgUp) are applied to the low-Vt cells to trim up their Vt. For MLC cells, different voltages are simultaneously applied to the drain (or source) lines of low-Vt cells while the word line voltage is fixed, which is also similar to the parallel MLC programming. The bit-by-bit Vt correction operation in the present invention possesses the following advantages. First, the cell Vt already in the correct Vt range of ($Vt_{min}$, $Vt_{max}$) will not be affected by the Vt correction operation. Secondly, the out-of-range Vt can be trimmed either up or down to bring it back to the correct Vt range. Thirdly, the Vt correction of all multi-levels can be performed at the same time. The bit-by-bit Vt correction method in the present invention is able to prolong the program/erase endurance cycles of flash memories.

In still another aspect, the present invention provides a manufacturable fabrication process suitable for NOR-type contactless flash memory arrays on SOI. The SOI memory cells of the present invention have several advantages over the traditional memory cells built on bulk silicon. First, the memory cell transistor of the present invention has symmetric source and drain junctions. No additional photo-masking step is required to create a double diffused source or drain junction. Secondly, the source/drain junctions of a memory cell transistor are low voltage junctions. The source/drain junctions are not required to sustain high voltage in the program and erase operations. The S/D junction voltages are zero in the program and erase operations. Thirdly, the device isolation for the transistors on SOI is provided by shallow trench isolation (STI) and bottom oxide. The high-voltage p-wells and deep n-wells, commonly used in the flash memory in bulk silicon for device isolation, are eliminated in the SOI process, which results in a saving of about three photo-masking steps. The SOI flash memory process is, in fact, simpler than most bulk flash memory processes. An exemplary SOI flash memory process flow is demonstrated for the NOR-type contactless flash memory arrays of the present invention. Only two photo-masking steps are required in fabricating the memory cell devices. The first photo-masking step is to define the poly-1 gate structures, which extend in the column-wise direction, using the poly-1 layer as a mask. The second photo-masking step is to define the word lines, which extend in the row-wise direction, using the poly-2 WL as a mask. This demonstrated memory cell process is a quadruple self-aligned process because (1) the n+ source/drain areas are self-aligned to the poly-1 gate structures, (2) the STI field oxides between adjacent columns are self-aligned to the poly-1 gate structures, (3) the floating gate wings (to increase coupling ratio) are self-aligned to the poly-1 gate structures, and (4) the floating gates are self-aligned to the word lines. The self-aligned process lowers the manufacturing cost by reducing the photo-masking steps and minimizes the misalignment from a photolithographic process. The self-aligned process is therefore advantageous to fabricate high-density small-geometry flash memories.

The details of one or more embodiments are set forth in the accompanying drawing and in the description below. Other features, objects, and advantages of the invention will become apparent from the description and drawings, and from the claims.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 1 is the cross-sectional view of the structural configuration of prior art flash memory cells.

FIG. 2 is a circuit diagram of the prior art flash memory array of FIG. 1.

FIG. 3a is a cross-sectional view showing the programming operation of the prior art flash memory cell of FIG. 1.

FIG. 3b is cross-sectional view showing the erasing operation of the prior art flash memory cell of FIG. 1.

FIG. 5a is a cross-sectional view taken along line 4A-4A' of FIG. 4.

FIG. 5b is a cross-sectional view taken along line 4B-4B' of FIG. 4.

FIG. 6 is the cross-sectional view of the structural configuration of the flash memory cell in accordance with the present invention.

FIG. 8a is a schematic diagram showing one example of threshold voltage distributions of memory cells in the programmed and erased states in accordance with the present invention.

FIG. 8b is a schematic diagram showing another example of threshold voltage distributions of memory cells in the programmed and erased states in accordance with the present invention.

DETAILED DESCRIPTION OF THE INVENTION

Figure 4:
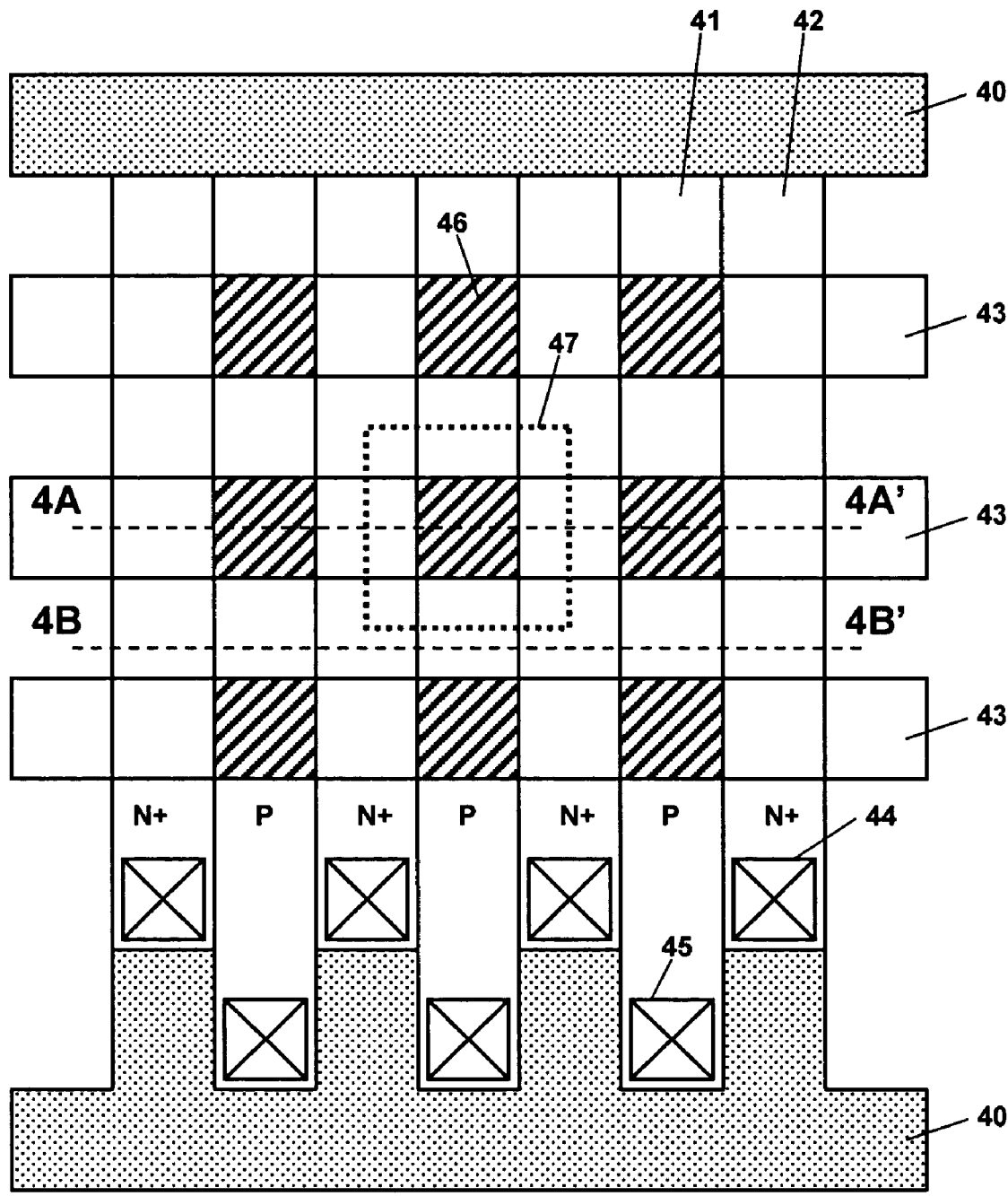
FIG. 4 is a layout plan view showing the memory array portion of the prior art flash memory array of FIG. 2.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

FIG. 6 schematically shows the flash memory cell structure of the present invention. The memory cells are fabricated on a SOI wafer, which consists of a silicon substrate 60, an oxide layer 61, and a p-type doped silicon thin film. Each of the memory cell transistors is constituted of a tunnel oxide film 62, a poly-1 floating gate (FG) 63, an inter-poly ONO insulating film 64, and a poly-2 control gate (CG) 65. The n+ source/drain (S/D) are formed by arsenic implantation into the p-type silicon thin film after the poly-1 floating gate 63 is patterned. The p-type doped silicon thin film is the body of the memory cell transistor. Each of the memory cell structure has field oxide (FOX) 66, which provides electrical isolation from adjacent memory cells. The field oxide clearly distinguishes the present invention from the memory cells in U.S. Pat. Nos. 5,796,142 and 5,885,868 that do not have field oxide between adjacent devices. Although disclosure us made in relation to FIG. 6 based on a stacked gate structure using certain materilas, it is understood that the present invention is compatible to other gate structures, for example, a split gate structure.

In accordance to an embodiment of the present invention, the source lines and the drain lines are buried lines, that is, the EEPROM memory cells are contactless. In accordance to another advantageous embodiment of the present invention, the source regions and the drain regions of a column of EEPROM memory cells, as shown in FIG. 6, are insulated from the source regions and the drain regions of the adjacent columns of EEPROM memory cells, which permits the drain and source voltages of the EEPROM memory cells to be addressable completely independent from the drain and source voltages of their neighboring EEPROM memory cells.

The memory cell employs uniform channel FN tunneling in both program and erase operations. The channel FN program and channel FN erase consume very little currents, in the order of 10 pA per cell. Therefore, a large number of flash cells can be programmed and erased simultaneously by on-chip charge pumps of economic area, or the charge pump areas can be relatively small compared to other program and erase mechanisms. The memory cells employing channel program and channel erase also show the least deterioration in the endurance characteristics because the trapped carriers are neutralized by the alternative electric fields. The data retention time is one order of magnitude longer than that of traditional ETOX cells, which is programmed by channel hot electron (CHE) injection and erased by FN tunneling. The improvement in data retentivity is due to the reduction of gate oxide leakage current by bi-polarity FN tunneling stress ("A Reliable Bi-polarity Write/Erase Technology in Flash EEPROMs", IEDM Tech. Digest, pp. 111-114, 1990).

Since the memory cell does not rely on the source/drain edge effects in program or erase operation, the source/drain junctions can be symmetric. The symmetric device structure helps to simplify the fabrication process and reduce the manufacturing cost.

Most other NOR-type flash memory devices utilize the edge effects in program or erase operation, such as the drain-side channel hot-electron (CHE) program, source-side FN erase, and drain-side FN program. The CHE program consumes more than 300 μA of current per cell. Hence only a few bits can be programmed at a time by an on-chip charge pump of economic area. The edge FN tunneling consumes about 10 nA of current per cell, which is still much larger than the channel FN tunneling current. The edge FN tunneling current is mostly constituted of the band-to-band tunneling (BBT) current flowing to the substrate. All the memory cells employing edge program or edge erase operations require process optimization on the source/drain junctions to enhance the program/erase efficiencies. Such process optimization normally results in asymmetric source/drain junctions, which adds more complexity to the manufacturing process.

Figure 7:
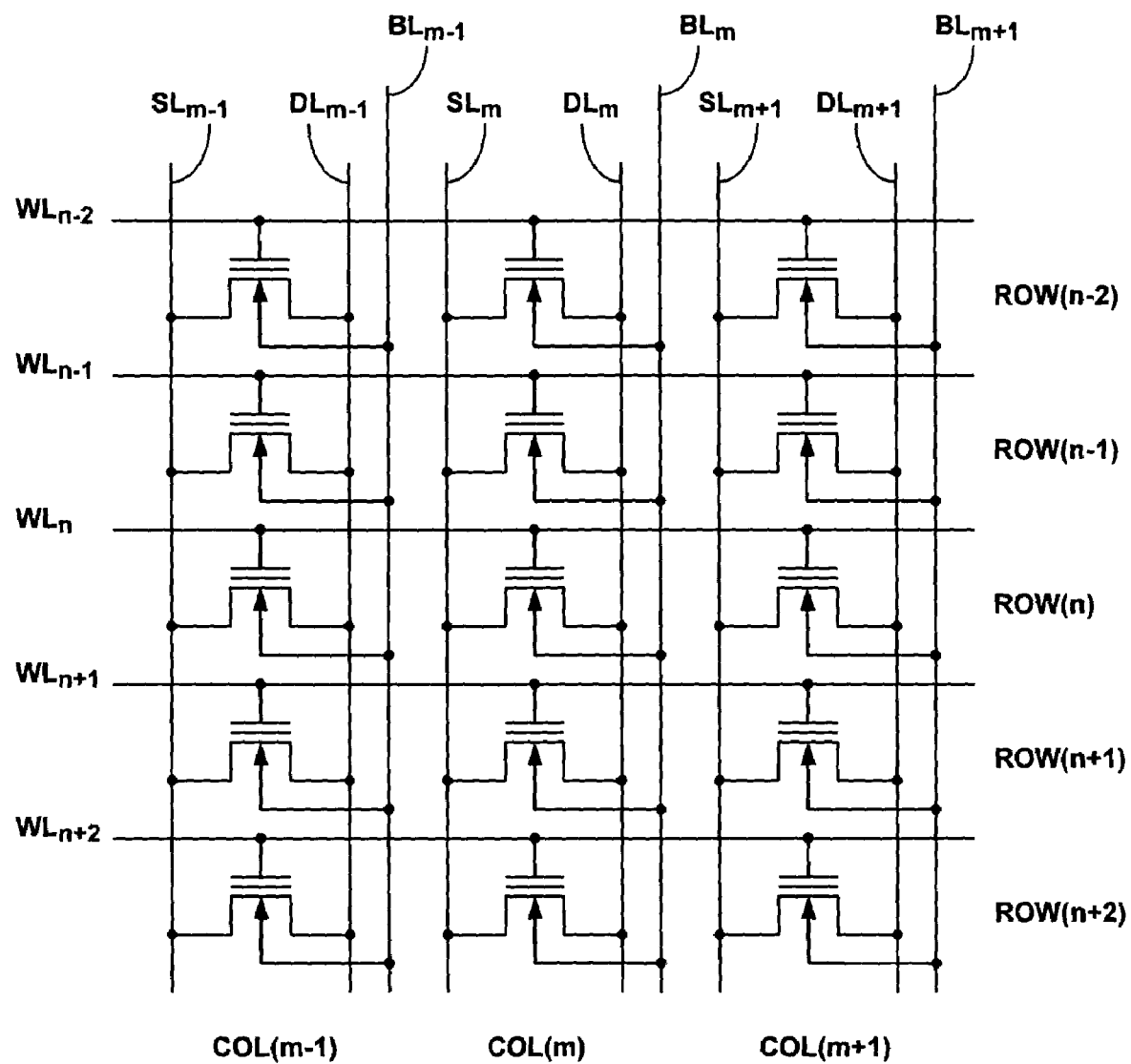
FIG. 7 is a circuit diagram showing the memory array portion in accordance with the present invention.

FIG. 7 is a circuit diagram showing the memory array portion of the present invention. The EEPROM memory cells are distributed in an array of rows and columns, and are constructed over a silicon-on-insulator wafer. Each EEPROM memory cell comprises a drain region, a source region, a gate region, and a body region. The memory cells are organized in a NOR-type contactless flash memory array on SOI. This array architecture is unique because all the four terminals (source, drain, gate, and body) of a memory cell are accessible from the outside through the source line (SL), drain line (DL), word line (WL), and body line (BL). In the present invention, the direction of the body lines is referred as the column direction. The direction of the word lines is referred as the row direction. It is understood that the columns and rows are defined purely for the ease of discussions. Either the body lines or the word lines can be defined as the column direction, and vice versa.

The memory array in FIG. 7 is clearly distinguished from the disclosures in U.S. Pat. Nos. 5,796,142 and 5,885,868 because two adjacent columns do not share the source/drain lines in between. In the present invention, each column has its own drain line, source line, and body line. None of them is shared with adjacent columns.

The unique array architecture of the present invention provides different program and erase operations to the memory cells. The program/erase operations generally can be classified into two types according to the threshold voltage (Vt) shift directions: (1) program-to-high/erase-to-low and (2) program-to-low/erase-to-high. FIGS. 8a and 8b shows the threshold voltage distributions in the programmed and erased states of the memory cells. The memory cell can be programmed to a high Vt state and erased to a low Vt state, as shown in FIG. 8a. The memory cell can also be programmed to a low Vt state and erased to a high Vt state, as shown in FIG. 8b. All the program and erase operations in the present invention employ channel Fowler-Nordheim (FN) tunneling effect.

The second type (program-to-low and erase-to-high) is more advantageous than the first type (program-to-high and erase-to-low) because the second type has no over-erase issue. Erase is a collective block operation in flash memories. The erase Vt distribution tends to be wider than the program Vt distribution. If one bit is over-erased (Vt<0 V), the whole column becomes leaky. The memory cells in the second type are erased to a high Vt state. The high-Vt cells are off in the read mode, so there is no over-erase issue. The second type could have an over-program issue, in which program Vt is too low. Since the program size is much smaller than the erase size, the program Vt distribution can be more tightly controlled than the erase Vt distribution. The first type's over-erase issue is generally of more concern than the second type's over-program issue.

The typical bias conditions for the first type, program-to-high/erase-to-low, are shown in TABLE 2, which includes two programming conditions, two erasing conditions, and one read condition. To program a cell to a higher Vt, a positive high voltage (e.g. 8 V in ProgUp1 and 16 V in ProgUp2) is applied to the word line (WL), and a relatively negative high voltage (e.g. −8 V in ProgUp1 and 0 V in ProgUp2) is applied to the drain line (DL). An inversion layer is induced in the semiconductor surface since the word line is positively biased. The channel region is connecting with both source and drain, so the channel potential is the same as the source/drain potential. The body bias is shielded from the floating gate by the charge in the inversion layer. The body bias has no effect on the cell programming. The channel potential can be supplied from either the source line or drain line. The other one can be floating. In the example of TABLE 2, the voltage is provided from the drain line and the source line is floating. The floating source will be charged to the drain potential via the channel.

TABLE 2

|  | ProgUp1 | ProgUp2 | EraseDn1 | EraseDn2 | Read |
|---|---|---|---|---|---|
| WL(sel) | 8 V | 16 V | −8 V | −16 V | Vdd |
| WL(unsel) | 0 V | 0 V | 0 V | 0 V | 0 V |
| BL | Floating | Floating | 8 V | 0 V | 0 V |
| SL | Floating | Floating | Floating | 0 V | 0 V |
| DL | −8 V/0 V | 0 V/8 V | Floating | 0 V | 1 V |

For the memory cells on the selected word line, which do not want to be programmed, a program-inhibit voltage Vinh (e.g. 0 V in ProgUp1 and 8 V in ProgUp2) is applied to the drain line (or source line). The CG-to-channel voltage is 8 V for the program-inhibited cells compared to 16 V for the cells to be programmed. The electric field between the channel region and the floating gate is relaxed. For channel FN tunneling, as a rule of thumb, 1-volt change in the CG-to-channel bias results in one order of magnitude change in the programming or erasing speed. The programming speed for the program-inhibited cells is 8 orders of magnitude slower than the cells to be programmed. Therefore, the program-inhibited cells are not programmed in the programming phase, which is usually completed within 10 mili-seconds (ms).

In the program operation, a programming pulse is followed by a sensing operation called program verify. If the cell Vt is higher than a predetermined target value, the cell will pass the program verify, and this cell is considered as being programmed. In the next programming pulse, the program-inhibit voltage will be applied to the drain line to reduce the electrical stress on the programmed cell. The programming pulses will be continuously applied to the selected WL and DL until all the cells, which are to be programmed, pass the program verify. It is a common practice that, the pulse width and/or the pulse height of the pulse waveforms on the WL and/or DL are incrementally increased as the number of the programming pulses increase.

To erase a cell to a lower Vt, a negative high voltage (e.g. −8 V in EraseDn1 and −16 V in EraseDn2) is applied to the word line (WL), and a relatively positive high voltage (e.g. 8 V in EraseDn1 and 0 V in EraseDn2) is applied to the body line (BL). The semiconductor surface is in the accumulation region because of a negative control gate voltage. The surface potential is determined by the body bias. The source/drain biases can be the same as the body bias (as in the case of EraseDn2), or they can be floating (as in the case of EraseDn1). When the source and drain are floating, they will be charged to a potential close to the body bias because of the forward biased source/drain p-n junctions.

The typical bias conditions for the second type, program-to-low/erase-to-high, are shown in TABLE 3, which includes two programming conditions, two erasing conditions, and one read condition. To program a cell to a lower Vt, a negative high voltage (e.g. −8 V in ProgDn1 and −16 V in ProgDn2) is applied to the word line (WL), and a relatively positive high voltage (e.g. 8 V in ProgUp1 and 0 V in ProgUp2) is applied to the body line (BL). The semiconductor surface is in the accumulation region because of a negative control gate voltage. The surface potential is the same as the body bias. The source/drain voltage has no effect on the cell programming, so the source and drain can be floating. The floating source/drain will be charged to a potential close to the body bias because of the forward biased source/drain p-n junctions.

TABLE 3

|  | ProgDn1 | ProgDn2 | EraseUp1 | EraseUp2 | Read |
|---|---|---|---|---|---|
| WL(sel) | −8 V | −16 V | 8 V | 16 V | Vdd |
| WL(unsel) | 0 V | 0 V | 0 V | 0 V | 0 V |
| BL | 8 V/0 V | 0 V/−8 V | Floating | Floating | 0 V |
| SL | Floating | Floating | Floating | Floating | 0 V |
| DL | Floating | Floating | −8 V | 0 V | 1 V |

For the memory cells on the selected word line that do not want to be programmed, a program-inhibit voltage Vinh (e.g. 0 V in ProgDn1 and −8 V in ProgDn2) is applied to the BL. The CG-to-body voltage is only 8 V for the program-inhibited cells, compared to 16 V for the cells to be programmed. The programming speed for the program-inhibited cells is about 8 orders of magnitude slower than the cells to be programmed. The program-inhibited cells, therefore, will not be programmed.

In the program operation, if the cell Vt is lower than a predetermined target value, the cell will pass the program verify, and this cell is considered as being programmed. In the next programming pulse, a program-inhibit voltage will be applied to the body line to reduce the electrical stress on the programmed cell. The programming pulses will be continuously applied to the selected WL and BL until all the cells, which are to be programmed, pass the program verify. It is a common practice that, the pulse width and/or the pulse height of the pulse waveforms on the WL and/or BL are incrementally increased as the number of the programming pulses increase.

To erase a cell to a higher Vt, a positive high voltage (e.g. 8 V in EraseUp1 and 16 V in EraseUp2) is applied to the word line, and a relatively negative high voltage (e.g. −8 V in EraseUp1 and 0 V in EraseUp2) is applied to the drain line (DL). An inversion layer is induced in the semiconductor surface by a positive word line voltage. The channel region is connected with the source and drain, so the channel potential is the same as the source/drain potential. The body bias has no effect on the cell programming, so the body is floating. Either SL or DL can be floating. SL is floating as shown in TABLE 3. The floating source will be charged to the drain potential via the channel which connecting the source and drain.

During the programming phase, the unselected word lines (including the word lines in the unselected blocks) are 0 V as shown in TABLES 2 and 3. The memory cells on the unselected word lines in a selected block may experience program disturb if any one of SL, DL, or BL is not 0 V. If the block has 256 word lines, the unselected cells may experience 255 (=256−1) times of program disturb. According to TABLES 2 and 3, the maximum CG-to-channel (or CG-to-body) voltage is 8 V for the unselected cells. The program disturb is 8 orders of magnitude slower than a programming process. The number of 255 is still negligible compared to $10^8$, so the program disturb is not a concern.

In the present invention, both the program and erase operations employ the uniform channel FN tunneling effect, which consume very little currents, as small as 10 pA per cell. A large number of flash cells can be programmed and erased simultaneously by on-chip charge pumps of economic area. The charge pumps can be much smaller than the charge pumps used for CHE program and edge FN erase. Smaller charge pumps save silicon area and reduce cost. Although CHE program is much faster than FN program by 3 orders of magnitude, typically 5 μs for CHE vs. 5 ms for FN. CHE program consumes a much larger current, typically 300 μA per cell, because the programming efficiency is very poor. Only a small number of electrons from the channel current have gained enough energy to cross the oxide/silicon potential barrier and inject into the floating gate. Because of the large current consumption, only a small number of bits, typically 8 bits (=1 byte), can be CHE programmed at a time by an on-chip charge pump of economic area. On the other hand, the memory size for channel program can range from one bit to one whole word line, which may consists of thousands of bits. Although the programming speed of channel program is slower than CHE program, the program size can be much larger than CHE program. The memory size for channel erase can range from one word line, a few word lines, one block, to the whole chip. The program and erase sizes are basically determined by the array configuration and applications, and are not limited by the programming and erasing currents.

In the present invention, there is no high voltage on the source/drain-to-body junctions in the program/erase/read operations. The source/drain junctions are not required to sustain high breakdown voltages. The source/drain junctions can be low-voltage junctions, and can be created by the same process as the source/drain junctions of low-voltage logic transistors. The source/drain junctions can symmetric. The symmetric device structure significantly helps to simplify the fabrication process and reduce the manufacturing cost. Most other flash memory cells rely on edge effects in program and/or erase, and have asymmetric source/drain junctions. The present invention is clearly distinguished from most other flash memories by this unique feature.

The physical dimensions of flash memory cells will be continuously scaled down in the future technologies. The source/drain junction depths, of both logic devices and memory cells, are required to be scaled down to suppress the short-channel effect. The junction breakdown voltage will be reduced for a shallow junction. The power supply voltage, Vdd, is also scaled down at the same rate with the channel length scaling to maintain constant electric fields in the channel and gate oxide. The reduction of junction breakdown voltage is not a problem for logic devices because the power supply voltage is also reduced. The tunnel oxide thickness of a flash memory cell has been reduced from 110 Å to 80 Å in the past 10 years. The tunnel oxide thickness is scaled down at a much slower rate than the gate oxide of logic devices due to the data retention concern. The program/erase high voltages are slowly scaled down approximately at the same rate with tunnel oxide scaling. For most flash memories other than the present invention, at least one of the source/drain junctions is required to sustain a high breakdown voltage such as 7 V. That requirement of a high junction breakdown voltage poses a serious limitation to scale down memory cells for the future high-density flash memories.

In a conventional stack-gate flash memory cell, charge is stored in the poly-1 floating gate. Storing charge on a single node is particularly prone to failure because one weak spot in the tunnel oxide could create a discharge path and cause the data retention problem. One solution to the problem is to use localized charge trapping in silicon nitride such as the SONOS (polysilicon-oxide-nitride-oxide-silicon) flash memory device. Another solution is to use distributed charge storage such as a large density of discrete silicon or germanium nanocrystal charge storage sites. As compared to conventional stack-gate flash memory devices, localized charge trapping and nanocrystal devices offer several advantages such as thinner tunnel oxide, lower program/erase voltages, and higher operating speed. In the present invention, the charge storage medium can be polysilicon, localized charge trapping materials (such as silicon nitride), or nanocrystals. The descriptions in the specification here can be applied to not only conventional stack-gate flash memory cells with polysilicon floating gate, but also flash memory cells with localized charge trappings or nanocrystals.

Figure 9:
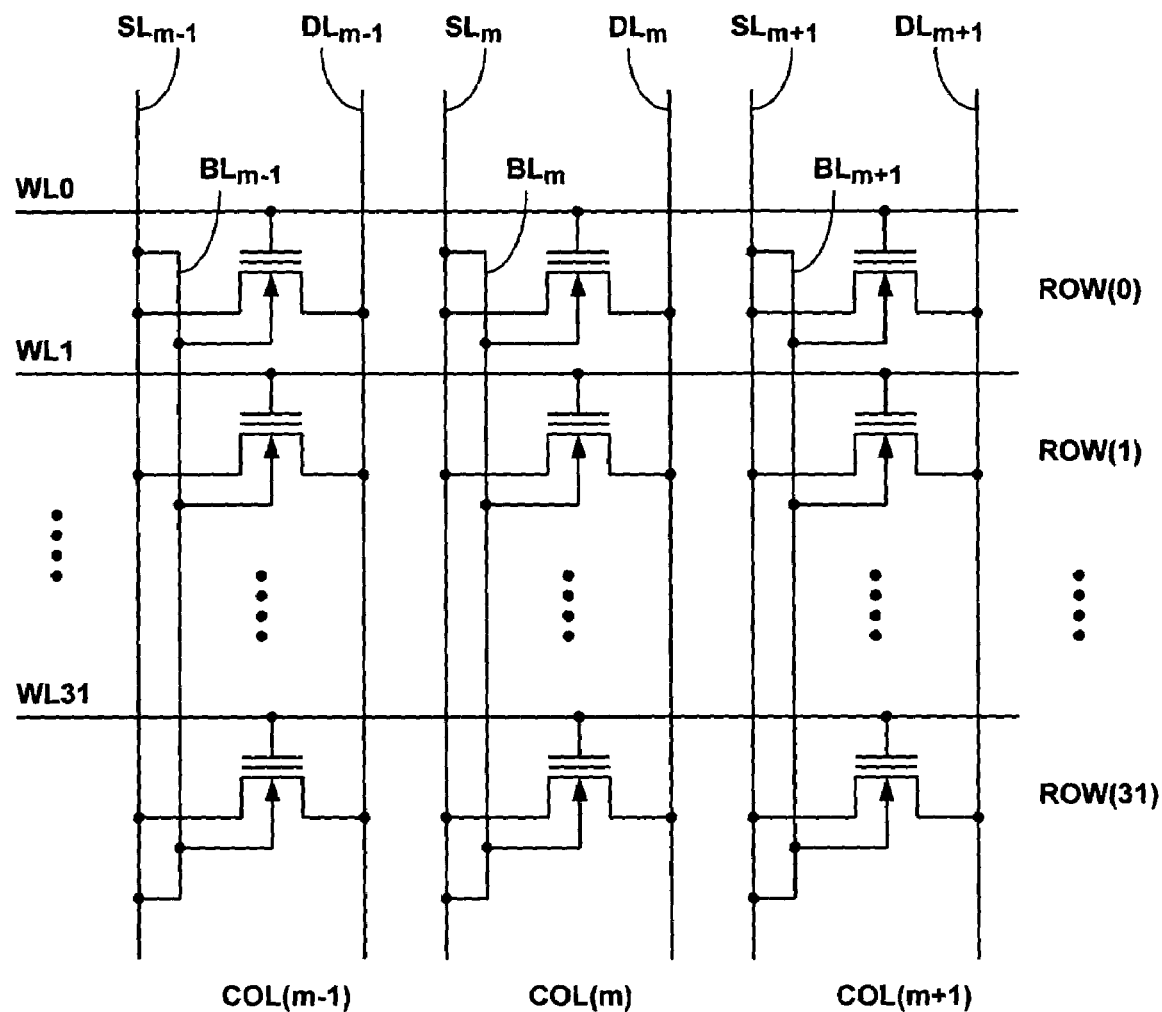
FIG. 9 is a circuit diagram of the memory array in accordance with the present invention wherein, in each column, the body line is connected to the source line.

In the present invention, the source can have the same potential as the body in all the program/erase/read operations in TABLES 2 and 3. The source line and the body line therefore can be tied together. FIG. 9 shows the body line is electrically connected to the source line at both ends of each column. In the example of FIG. 9, this block has 32 word lines. The p-type body can be electrically short to the n-type source region by forming a butted contact over the n+ source region and p+ well tap. For each column, the number of vertical interconnects (orthogonal to the horizontal word lines) therefore can be reduced from three (source line, drain line, and body line) to two (source line and drain line). Since the source line and body line are electrically connected, it can be either called a source line or a body line. This embodiment advantageously relaxes the requirement of vertical interconnects and simplify the Y-select gate circuitry.

The cell operation conditions can be simplified when the body line is connected to the source line. TABLES 4 and 5 are the simplified versions of TABLES 2 and 3, respectively. The cell operations employ uniform channel program and uniform channel erase by FN tunneling effect. The memory cell can be programmed to a high Vt state and erased to a low Vt state, as shown in TABLE 4. The memory cell can also be programmed to a low Vt state and erased to a high Vt state, as shown in TABLE 5. To shift up the cell Vt, a positive control gate voltage is applied and a channel is formed in the semiconductor surface. The channel potential can be supplied from either the source line or drain line. As in the examples of TABLES 4 and 5, the channel potential is supplied from the drain line such as in the operations of ProgUp1, ProgUp2, EraseUp1, and EraseUp2. TABLES 4 and 5 do not require high breakdown voltages for the source and drain junctions. The source/drain junctions can be low-voltage shallow junctions, and can be created by the same process as the source/drain junctions in logic transistors. This feature enables the flash memory of the present invention to be continuously scaled down to small dimensions for the future technologies.

TABLE 4

|  | ProgUp1 | ProgUp2 | EraseDn1 | EraseDn2 | Read |
|---|---|---|---|---|---|
| WL(sel) | 8 V | 16 V | −8 V | −16 V | Vdd |
| WL(unsel) | 0 V | 0 V | 0 V | 0 V | 0 V |
| SL(=BL) | Floating | Floating | 8 V | 0 V | 0 V |
| DL | −8 V/0 V | 0 V/8 V | Floating | 0 V | 1 V |

TABLE 5

|  | ProgDn1 | ProgDn2 | EraseUp1 | EraseUp2 | Read |
|---|---|---|---|---|---|
| WL(sel) | −8 V | −16 V | 8 V | 16 V | Vdd |
| WL(unsel) | 0 V | 0 V | 0 V | 0 V | 0 V |
| SL(=BL) | 8 V/0 V | 0 V/−8 V | Floating | Floating | 0 V |
| DL | Floating | Floating | −8 V | 0 V | 1 V |

A NOR-type contactless flash memory array architecture similar to FIG. 9 was proposed in U.S. Pat. No. 6,438,030. Their memory cells are fabricated on bulk silicon, instead of SOI. Each column of the array is located within an isolated p-well. The p-well is common to the cells in the column, but isolated from the p-wells of adjacent columns. The p-wells of each column are separated by trench isolations of a depth of 0.35-0.65 μm. The trench is required to be deeper than the p-well for device isolation. The process needs to provide two kinds of trench isolations—shallow trench isolation for low-voltage logic devices and deep shallow trench isolation for memory cells. The additional deep trench isolation inevitably increases the memory cell size and process complexity. The p-well cannot be very shallow because of the junction breakdown voltage requirement. The junction breakdown voltage between the p-well to the underneath deep n-well junction needs to be larger than 8 V according to their program/erase conditions. The program/erase operations are uniform channel program and uniform channel erase, which consume very small currents. The program operation increases the cell Vt and the erase operation decreases the cell Vt. The memory array built on bulk silicon has p-well to deep n-well junction capacitance of large area. The junction capacitance needs to be charged and discharged in every program and erase pulses. The program/erase current levels are therefore increased. On the other hand, the devices built on SOI have minimum junction capacitances. The SOI devices have source/drain-to-body junction capacitances of small area, but not p-well to deep n-well junction capacitance. In summary, compared to the present invention, the flash memory in U.S. Pat. No. 6,438,030 built on bulk silicon has a larger cell size, more complicated fabrication process, higher manufacturing cost, larger junction capacitance, higher program/erase current levels, and less scalable.

The growing demand of storage capacities in the portable computing and telecommunication markets has driven the development of high-density flash memories. The storage capacities have remarkably increased in the past few years by the progress of manufacturing processes and the capability of multi-level storage. Multi-level storage implies the capability of storing more than one bit in one memory cell. This multi-level cell (MLC) technology lowers the cost by enabling the storage of multiple bits of data per memory cell thereby reducing the consumption of silicon area. For the MLC of 2 bits per cell, four different levels of threshold voltage need to be correctly stored and identified in a memory cell. The intervals between two adjacent Vt levels are inevitably reduced as the number of Vt levels increases.

Figure 10A:
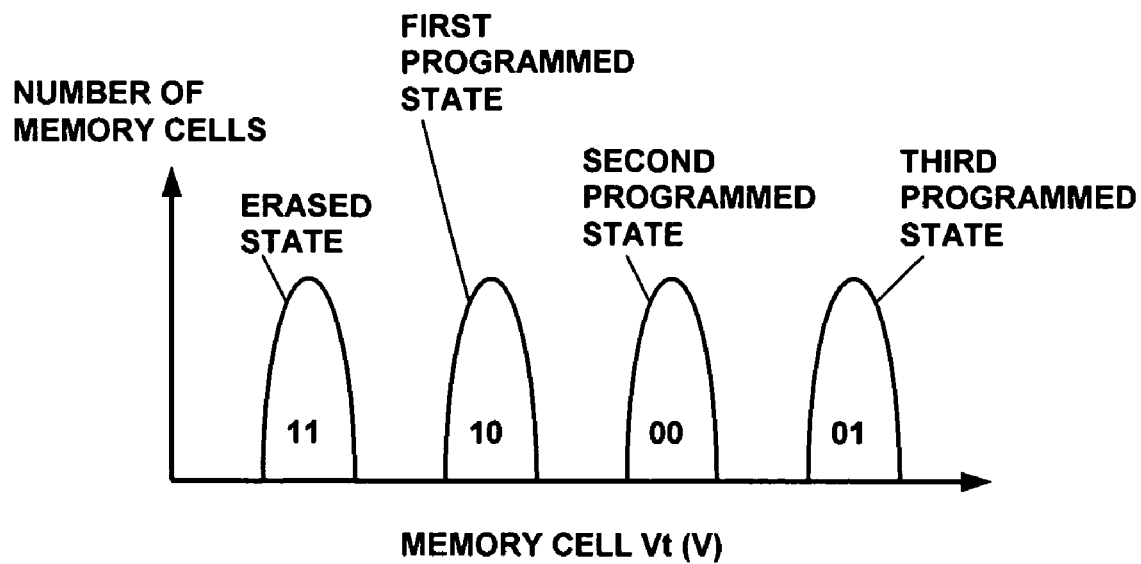
FIG. 10a is a schematic diagram showing one example of threshold voltage distributions of multilevel memory cells in accordance with the present invention.
Figure 10B:
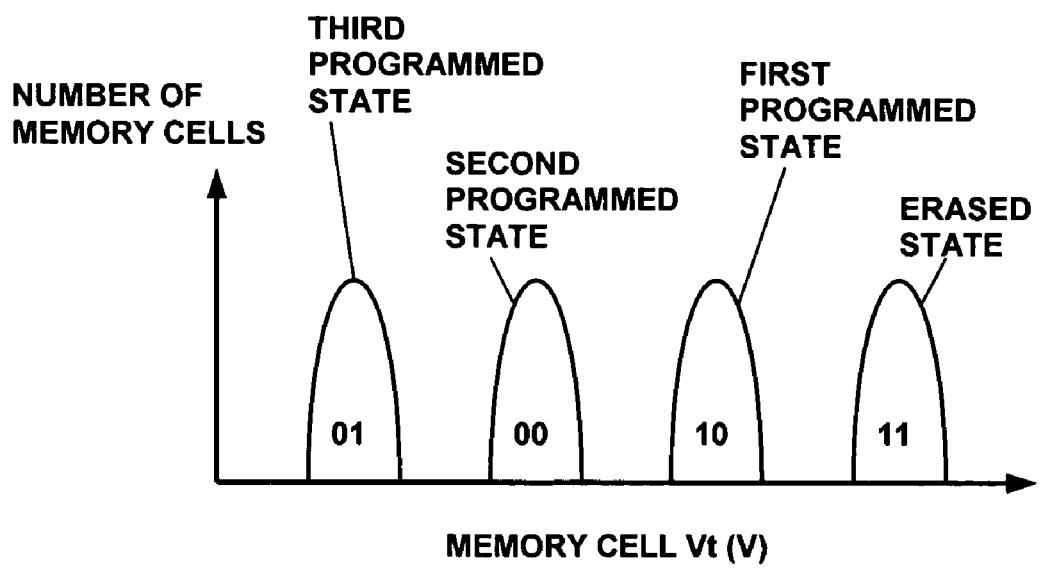
FIG. 10b is a schematic diagram showing another example of threshold voltage distributions of multilevel memory cells in accordance with the present invention.

The memory cells are capable of storing data of two bits per cell and can be placed in the states of threshold voltages as shown in FIGS. 10*a* and 10*b*. In the present invention, the erased state can be a low-Vt state or a high-Vt state. FIG. 10*a* illustrates the relationship between the stored data and the threshold voltage distributions for 2 bits per cell storage when the erased state is a low-Vt state. FIG. 10*b* illustrates the relationship between the stored data and the threshold voltage distributions for 2 bits per cell storage when the erased state is a high-Vt state. Assume the data of "11" represent an erased state. The three programmed states contain the data of "10", "00", and "01". For two adjacent Vt levels, only one bit is different. Therefore, if a memory cell's Vt is shifted to a neighboring Vt state due to program disturb, charge loss, or other adverse effects, only one bit is affected.

For CHE programming, the cell Vt can be precisely controlled by the word line voltage. To achieve multilevel storage using CHE programming, the bit line voltages are fixed and the word line voltage is varied in accordance with the multilevel data to be stored. This sequential program operation has longer programming time and higher program disturb error rate than parallel MLC programming. The parallel MLC programming method was proposed in U.S. Pat. No. 5,995,412 to shorten the MLC programming time. In this method, the word line voltage is fixed and specified voltages are simultaneously applied to the bit lines to program multilevel data into the memory cells. The bit line voltages are provided by the bit line voltage generation circuits based on the input multilevel data stored in the latch circuits. The parallel MLC programming method is suitable for the flash memories in which the bit line voltage can precisely control the programmed Vt. One example is the NAND flash, which employs channel FN program. The difference between the word line voltage and bit line voltage determines the programmed Vt. If the word line voltage is fixed, then the bit line voltage has the control.

Figure 11A:
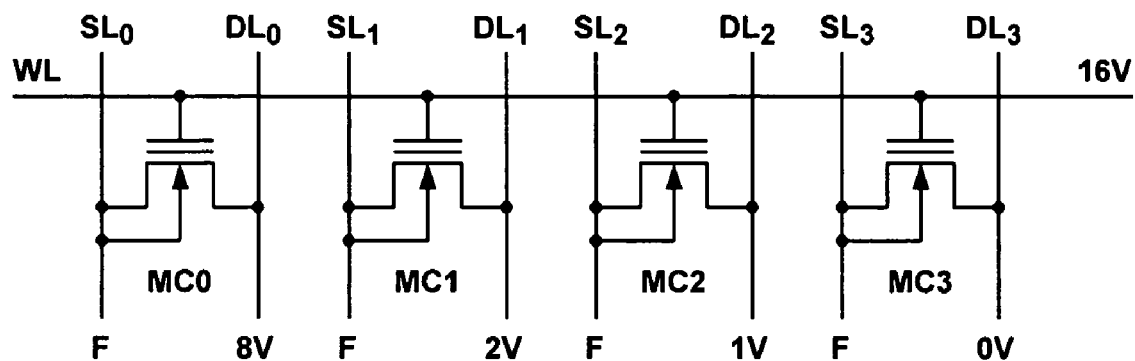
FIG. 11a is a circuit diagram showing one example of the parallel MLC program operation in accordance with the present invention in which different specified voltages are simultaneously applied to the drain lines.

In the present invention, the cell is programmed by channel FN tunneling effect. The cell Vt can be programmed to either a higher value or a lower value. When the cell Vt is programmed to a higher value, parallel MLC programming can be implemented by simultaneously applying different specified voltages based on the input multilevel data to the drain lines (as shown in FIG. 11a) or the source lines. Because a channel region is formed when the word line is positively biased, the channel potential can be supplied from either the drain line or the source line. For the parallel MLC programming in U.S. Pat. No. 5,995,412, only the bit lines, i.e. the drain lines, are supplied with different specified voltages to program multilevel data into memory cells.

The programmed Vt depends on electrical stress on the tunnel oxide when performing FN tunneling. The stress is in turn determined by the voltage difference between the word line and the channel. FIG. 11a shows one example of parallel MLC programming, in which the program operation is ProgUp2 in TABLE 4. Cell Vt shifts to a higher value in the program operation. The initial and final states of the four memory cells are shown in TABLE 6 below.

TABLE 6

|  | Cell | | | |
| --- | --- | --- | --- | --- |
|  | MC0 | MC1 | MC2 | MC3 |
| Initial Vt | 1 V | 1 V | 1 V | 1 V |
| Initial State | (11) | (11) | (11) | (11) |
| Final Vt | 1 V | 2 V | 3 V | 4 V |
| Final State | (11) | (10) | (00) | (01) |

Before performing MLC parallel programming, all memory cells are in the erased state, i.e. "11" state, with Vt of 1 V. The Vt of the memory cell MC0 is left unchanged with the stored data of "11", which is the erased state. The memory cell MC1 is to be programmed with the data of "10", which is the first programmed state. The memory cell MC2 is to be programmed with the data of "00", which is the second programmed state. The memory cell MC3 is to be programmed with the data of "01", which is the third programmed state. The word line voltage is fixed in a programming pulse, such as 16 V in FIG. 11a. The word line voltage can be increased with the number of programming pulses to insure slow bits can also be programmed. The drain (or source) line voltages are applied with 8 V, 2 V, 1 V, and 0 V for the memory cells MC0, MC1, MC2, and MC3, respectively. The CG-to-channel voltages are 8 V, 14 V, 15 V, and 16 V for the memory cells MC0, MC1, MC2, and MC3, respectively. For channel FN tunneling in the current flash technology, as a rule of thumb, 1-volt change in the CG-to-channel bias results in one voltage change in the programmed Vt. Therefore, the programmed Vt of the memory cells MC1, MC2, and MC3 will be roughly 1 volt spaced apart. If the stored data coincide with the input data, a program-inhibit voltage, which is 8 V as in FIG. 11a, is applied to the drain line of MC0. The disclosure in U.S. Pat. No. 5,995,412 suggested to float the bit line for the bit not to be programmed. A floating node will be coupled to some voltage, which is usually ground, i.e. 0 V. The floating bit line idea from the prior art does not work for the present invention because the program-inhibit voltage can be different from 0 V. For the present invention as shown in FIG. 11a, the floating bit line cannot inhibit a cell being programmed.

Figure 11B:
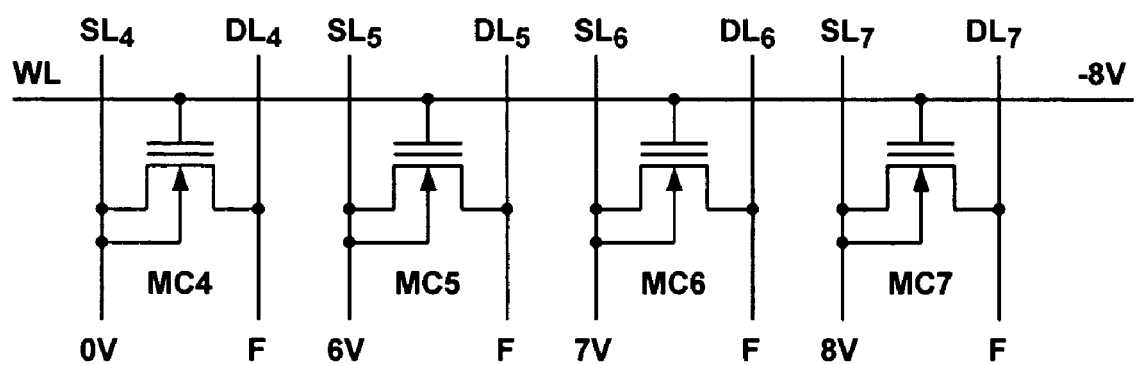
FIG. 11b is a circuit diagram showing another example of the parallel MLC program operation in accordance with the present invention, in which different specified voltages are simultaneously applied to the source lines (=body lines).

FIG. 11b shows another example of parallel MLC programming, in which the program operation is ProgDn1 in TABLE 5. Cell Vt shifts to a lower value in this program operation. The initial and final states of the four memory cells are shown in TABLE 7 below.

TABLE 7

|  | Cell | | | |
| --- | --- | --- | --- | --- |
|  | MC4 | MC5 | MC6 | MC7 |
| Initial Vt | 4 V | 4 V | 4 V | 4 V |
| Initial State | (11) | (11) | (11) | (11) |
| Final Vt | 4 V | 3 V | 2 V | 1 V |
| Final State | (11) | (10) | (00) | (01) |

Before performing MLC parallel programming, all memory cells are in the erased state, i.e. "11" state, with a high Vt of 4 V. The memory cell MC4 Vt is left unchanged with the stored data of "11", which is the erased state. The memory cell MC5 is to be programmed with the data of "10", which is the first programmed state. The memory cell MC6 is to be programmed with the data of "00", which is the second programmed state. The memory cell MC7 is to be programmed with the data of "01", which is the third programmed state. The word line voltage is fixed in a programming pulse, such as −8 V in FIG. 11b. The drain lines are floating. The body lines, which are connected to the source lines, are supplied with 0 V, 6 V, 7 V, and 8 V for the memory cells MC4, MC5, MC6, and MC7, respectively. The CG-to-body voltages are 8 V, 14 V, 15 V, and 16 V for the memory cells MC4, MC5, MC6, and MC7, respectively. As a rule of thumb, the programmed Vt of the memory cells MC5, MC6, and MC7 will be roughly 1 volt spaced apart. If the stored data coincide with the input data, a program-inhibit voltage, which is 0 V as shown in FIG. 11b, is applied to the body line of MC4.

When the cell Vt is programmed to a lower value, parallel MLC programming can be implemented by simultaneously applying different voltages to the body lines (or the source lines if the source lines are connected to the body lines) based on the input multilevel data, while the word line voltage is fixed, as shown in FIG. 11b. Because the semiconductor surface is in the accumulation region when the word line is negatively biased, the surface potential is supplied from the body line. The parallel MLC programming in U.S. Pat. No.

5,995,412 does not cover the situation in which the body lines are applied with different programming voltages.

Figure 12:
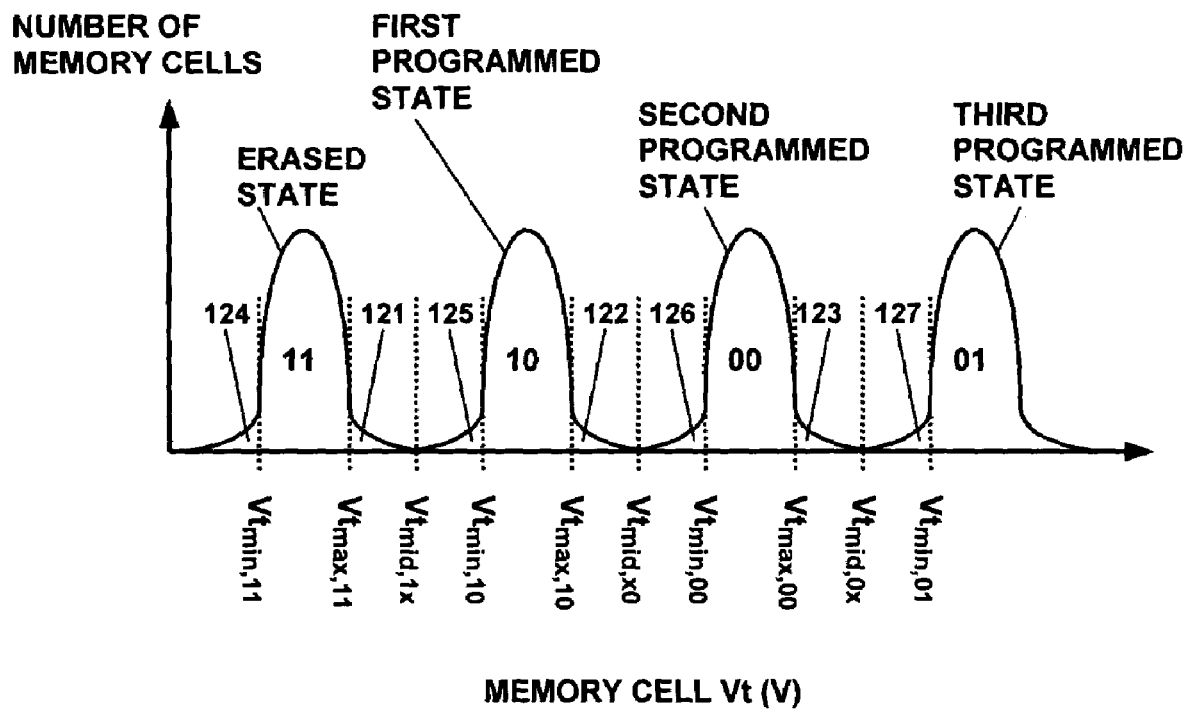
FIG. 12 is a schematic diagram illustrating the broadened threshold voltage distributions for multilevel memory cells.

For the multilevel flash memory that is first programmed with data, the Vt distributions are tight and completely separated as shown in FIGS. 10a and 10b. However, the Vt distributions become gradually broadened, as shown in FIG. 12, as subsequent program, erase, and read operations are repeatedly executed. The Vt variations can be caused by the charge gain and charge loss in the mechanisms of program/erase/read disturbs, charge trapped in tunnel oxide, and data retention issues. This phenomenon also occurs in ordinary Single Level Cells (SLC), which store one bit per cell. However, this phenomenon is more severe in multilevel flash memories, in which the intervals between the individual Vt distributions are narrower.

In accordance with the present invention, the memory states of the EEPROM memory cells can be programmed by applying a first set of one or more voltages at the gate lines and erased by applying a second set of one or more voltages at the gate lines. The first set of voltages can be higher or lower than the second set of voltages. The first set of voltages can be positive and the second set of voltages negative. Conversely, the first set of voltages can be negative and the second set of voltages positive.

The EEPROM memory cells can be programmed to two or more memory states by applying the first set of two or more voltages at the gate lines. A row of EEPROM memory cells are programmed to two or more memory states by applying two or more voltages to different source lines and applying a fixed voltage at the gate line connecting to the row of EEPROM memory cells. Similarly, a row of EEPROM memory cells are programmed to two or more memory states by applying two or more voltages to different drain lines or body lines and applying a fixed voltage at the gate line connecting to the row of EEPROM memory cells.

FIG. 12 shows one example of the Vt distributions, in which the erased state is a low-Vt state. The Vt distributions have been broadened by adverse charge gain and charge loss effects. Each Vt level has an upper limit $Vt_{max}$ and a lower limit $Vt_{min}$, except for the highest Vt level of "01" that has no requirement of $Vt_{max}$. Cell Vt must be within the range, i.e. $Vt_{min} < Vt < Vt_{max}$, so that the stored data can be correctly identified in the sensing operations, such as program verify, erase verify, and read. Every two adjacent Vt levels are separated by an interval. Generally, the center of an interval is the boarder line between two neighboring states. The boarder lines are labeled as $Vt_{mid,1x}$, $Vt_{mid,x0}$, and $Vt_{mid,0x}$ in FIG. 12. The Vt of a nominal cell should not fall into the interval region. However, a cell is repairable as long as its Vt does not cross the boarder line to a neighboring state.

A bit-by-bit Vt correction operation, which was called a refresh operation, has been proposed in U.S. Pat. No. 6,226,198 to tighten the Vt distributions. Their refresh operation starts with a weak erase pulse applied to the word line to slightly shift up the Vt of all memory cells on the word line by about 0.2 V. Program operation is then applied to the cells with Vt higher than $Vt_{max}$ to lower down their Vt levels. Similar refresh operations are executed for each level of multilevel storage. The refresh operation in U.S. Pat. No. 6,226,198 has three major drawbacks. First, all the cell Vt's are affected by the weak erase pulse, even the Vt's which are already within the distribution ranges ($Vt_{min}$, $Vt_{max}$). Secondly, cell Vt is only allowed to shift down in the bit-by-bit program operation. Thirdly, the refresh operation needs to be repeated for each Vt level for multilevel cells.

Generally, for flash memories, the program operation is performed on a bit-by-bit basis, and the erase operation is performed on a block or on an entire array, at one time. The erase operation is unable to perform on the bit-by-bit basis. The program operation can shift the cell Vt either up (such as CHE program) or down (such as edge FN tunneling), but not both. The memory cell structure and array architecture of the present invention allow the cell Vt to be trimmed up and down on the bit-by-bit basis. The present invention offers different program operations (such as ProgUp1, ProgUp2, ProgDn1, and ProgDn2 in TABLES 2-5), which enable flexible Vt fine-tune strategies to tighten the Vt distributions.

Figure 13:
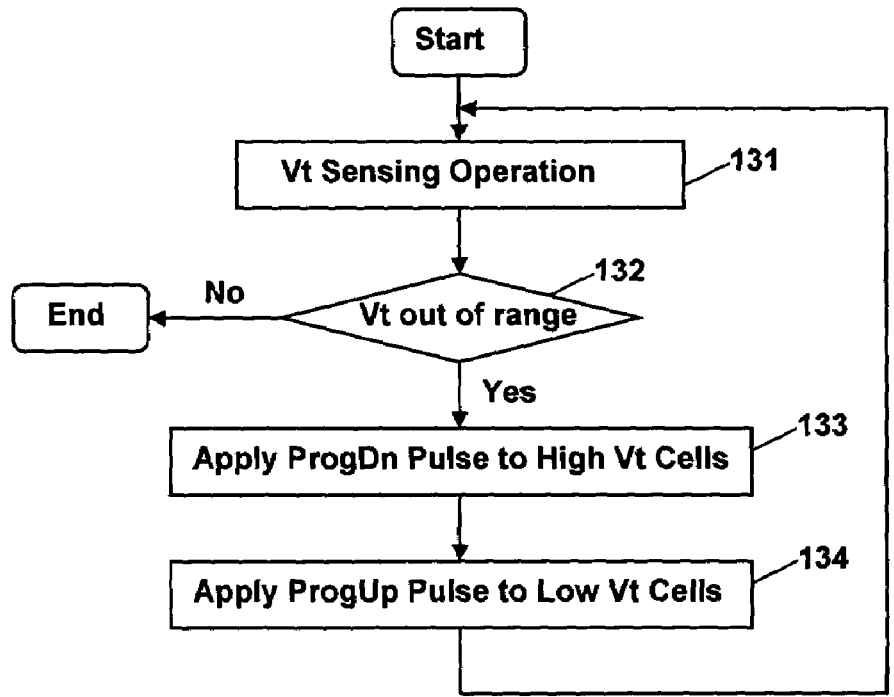
FIG. 13 is a flow chart of the bit-by-bit Vt correction operations in accordance with the present invention, in which ProgUp and ProgDn operations are defined in TABLES 2-5.

The bit-by-bit Vt correction method in the present invention is to tighten the Vt distributions by bringing the out-of-range Vt back into the range of ($Vt_{min}$, $Vt_{max}$). FIG. 13 is a flow chart showing the procedure of the bit-by-bit Vt correction operation. The Vt correction operation starts with a sequence of sensing operations (step 131) to identify the cells with out-of-range Vt. In the sensing operations, different voltages, such as $Vt_{min,11}$, $Vt_{max,11}$, $Vt_{mid(10,11)}$, etc., are sequentially applied to the selected word line. The cells with out-of-range Vt, either higher than $Vt_{max}$ or lower than $Vt_{min}$ can be identified. The cells with Vt higher than $Vt_{max}$ are labeled as 121, 122, and 123 in FIG. 12 for the states of "11", "10", and "00", respectively. The cells with Vt lower than $Vt_{min}$ are labeled as 124, 125, 126, and 127 in FIG. 12 for the states of "11", "10", "00", and "01", respectively. If there is no cell with out-of-range Vt, the Vt correction operation is stopped (step 132). If high Vt cells are identified, one or more program pulses (step 133) are applied to the high Vt cells to trim down their Vt. The program operations of ProgDn1 and ProgDn2 in TABLES 3 and 5 can be used here. Similar to the parallel MLC programming, different voltages are simultaneously applied to the body lines of high-Vt cells while the word line voltage is fixed. All the high-Vt cells of different multi-levels can be repaired at the same time. If low-Vt cells are identified, one or more program pulses (step 134) are applied to the low-Vt cells to trim up their Vt. The program operations of ProgUp1 and ProgUp2 in TABLES 2 and 4 can be used here. Similar to the parallel MLC programming, different voltages are simultaneously applied to the drain (or source) lines of low-Vt cells while the word line voltage is fixed. All the low-Vt cells of different multi-levels can be repaired at the same time.

The bit-by-bit Vt correction operation in the present invention has overcome all the three drawbacks in U.S. Pat. No. 6,226,198. First, the cell Vt already in the correct Vt range of ($Vt_{min}$, $Vt_{max}$) are not affected by the Vt correction operation. Secondly, the out-of-range Vt can be trimmed either up or down to bring it back to the correct Vt range. Thirdly, the Vt correction of all multi-levels can be performed at the same time. The Vt correction operation described above is not limited to MLC. It can also apply to single level cells (SLC) as well.

Figure 14:
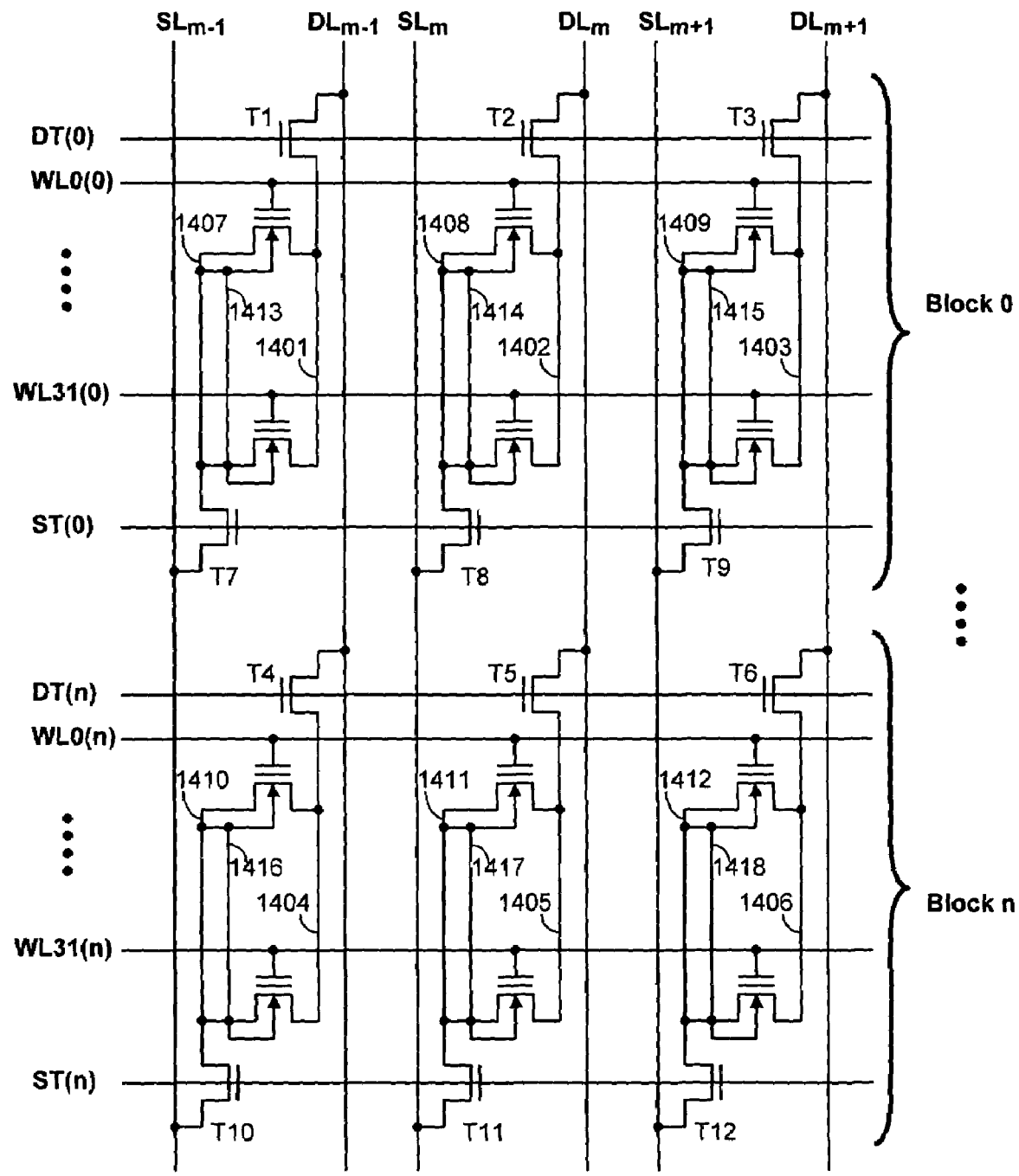
FIG. 14 is a circuit diagram of a NOR-type contactless flash array on SOI in accordance with one embodiment of the present invention.

FIG. 14 is a circuit diagram showing one example of a NOR-type contactless flash array on SOI of the present invention. The array is divided into blocks or sectors. In this memory cell array, local drain lines 1401-1406, which can also be called sub-drain lines, each are connected with the drains of the memory cells in the same column. The local drain lines are also connected to respective main drain lines $DL_{m-1}$-$DL_{m+1}$, which can also be called global drain lines, via drain select transistors T1-T6. Local source lines 1407-1412, which can also be called sub-source lines, each are connected with the sources of the memory cells in the same column. The local source lines are also connected to respective main source lines $SL_{m-1}$-$SL_{m+1}$, which can also be called global source lines, via source select transistors T7-T12. Local body lines 1413-1418, which can also be called subbody lines, each are connected with the bodies of the memory cells in the same column. The local body lines 1413-1418 each are connected to the local source lines 1407-1412 at both ends of the columns. Hence the main source lines $SL_{m-1}$-$SL_{m+1}$ can also be called main body lines or global body lines $BL_{m-1}$-$BL_{m+1}$. Furthermore, control gates of the memory cells in the same row are connected to a corresponding word line WL0(0)-WL31(0) in common for block 0, and WL0(n)-WL31(n) for block n. The drain select gate signal line DT(0) is connected to each gate of the drain select transistors T1-T3 in block 0. The drain select gate signal line DT(n) is connected to each gate of the drain select transistors T4-T6 in block n. The source select gate signal line ST(0) is connected to each gate of the source select transistors T7-T9 in block 0. The source select gate signal line ST(n) is connected to each gate of the source select transistors T10-T12 in block n.

In FIG. 14, the drain select transistors T1-T6 and source select transistors T7-T12 are all n-channel MOS transistors. The array architecture in FIG. 14 can support the program/erase operations of ProgUp2/EraseDn1 and ProgUp2/EraseDn2 in TABLE 4 and ProgDn1/EraseUp2 in TABLE 5. In the above cell operations, there is no negative voltage applied to SL, DL, and BL. All the voltages applied to SL, DL, and BL are either positive voltages or 0 V. High-voltage n-channel MOS transistors can be used as the select gate transistors T1-T12. For other program/erase operations, there might be negative voltages applied to SL, DL, and BL. The select gate circuits need to have both n- and p-channel MOS transistors to control negative voltages. The select gate circuit becomes more complicated than the circuit in FIG. 14.

Figure 15:
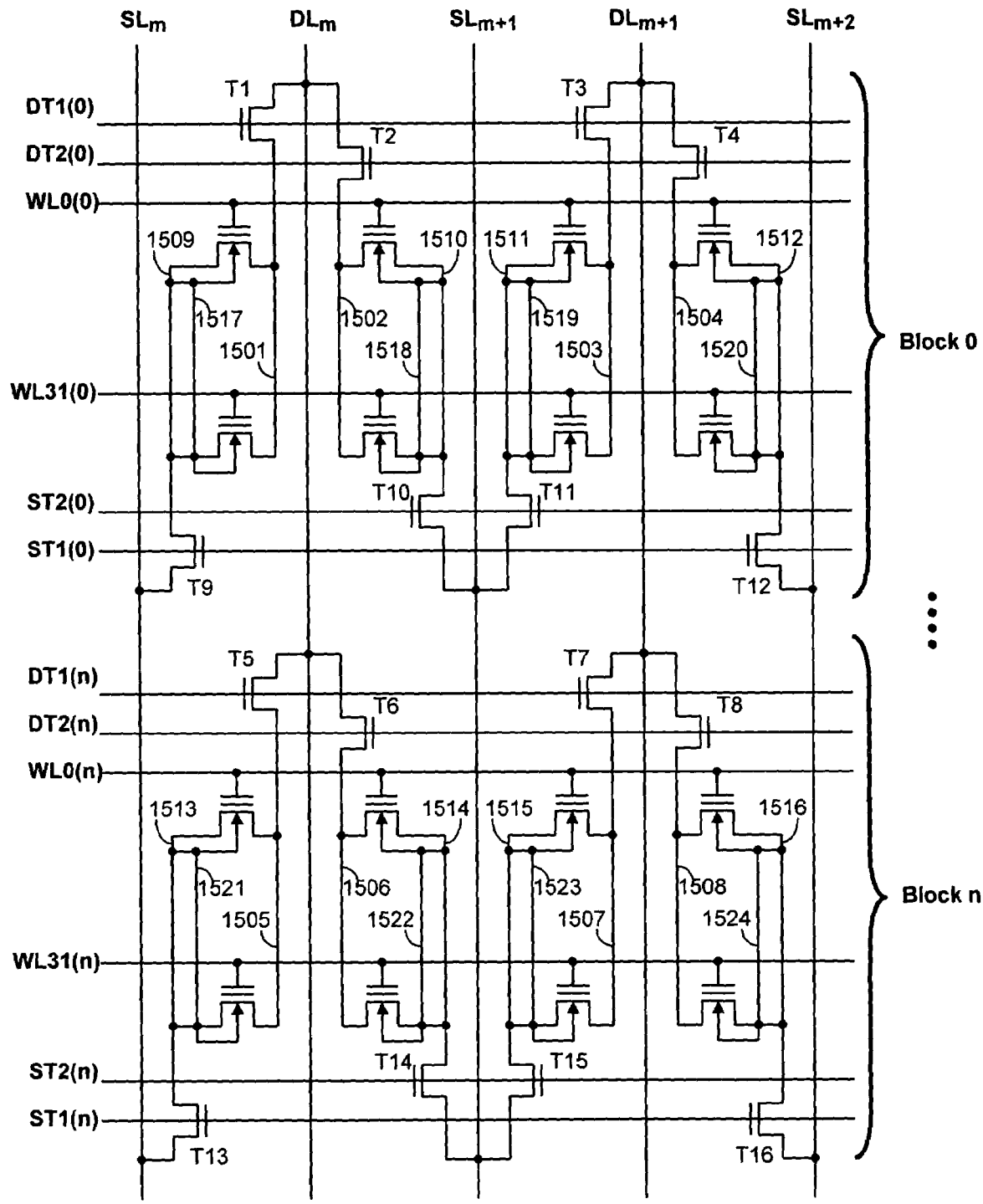
FIG. 15 is a circuit diagram of a NOR-type contactless flash array on SOI in accordance with another embodiment of the present invention.

In an array block of FIG. 14, there is one global source line for each local source line, and one global drain line for each local drain line. The local source lines and local drain lines are made of buried n+ diffusions (will be described later) in the contactless array. The global source lines and global drain lines are made of interconnect metal lines, for example, the first layer of metal, i.e. metal-1, to reduce series resistance. In order to scale down the memory cell size, a column decoding scheme can be used so that the cell x-pitch is not limited by the metal pitch. FIG. 15 is a circuit diagram showing another example of a NOR-type contactless flash array on SOI of the present invention. In the memory array of FIG. 15, local drain lines 1501-1508 are connected to global drain lines $DL_m$-$DL_{m+1}$ via drain select transistors T1-T8. Local source lines 1509-1516 are connected to global source lines $SL_m$-$SL_{m+2}$ via source select transistors T9-T16. Local body lines 1517-1524 each are connected to the local source lines 1509-1516 at both ends of the columns. Control gates of the memory cells in the same row are connected to a corresponding word line WL0(0)-WL31(0) in common for block 0, and WL0(n)-WL31(n) for block n. The drain select gate signal lines DT1(0), DT2(0), DT1(n), and DT2(n) are connected to the gates of drain select transistors T1-T8. The source select gate signal lines ST1(0), ST2(0), ST1(n), and ST2(n) are connected to the gates of source select transistors T9-T16. In an array block, two local drain lines can connect to one global drain line via the drain select transistors, and two local source lines can connect to one global source line via the source select transistors. The number of global drain lines and the number of global source lines can be reduced to one half. The memory cell x-pitch is therefore not limited by the metal pitch. When using a column decoding scheme, each global drain line can connect to $2^n$ local drain lines via the drain select transistors, and each global source line can connect to $2^n$ local source lines via the source select transistors, where n is a positive integer.

Figure 16:
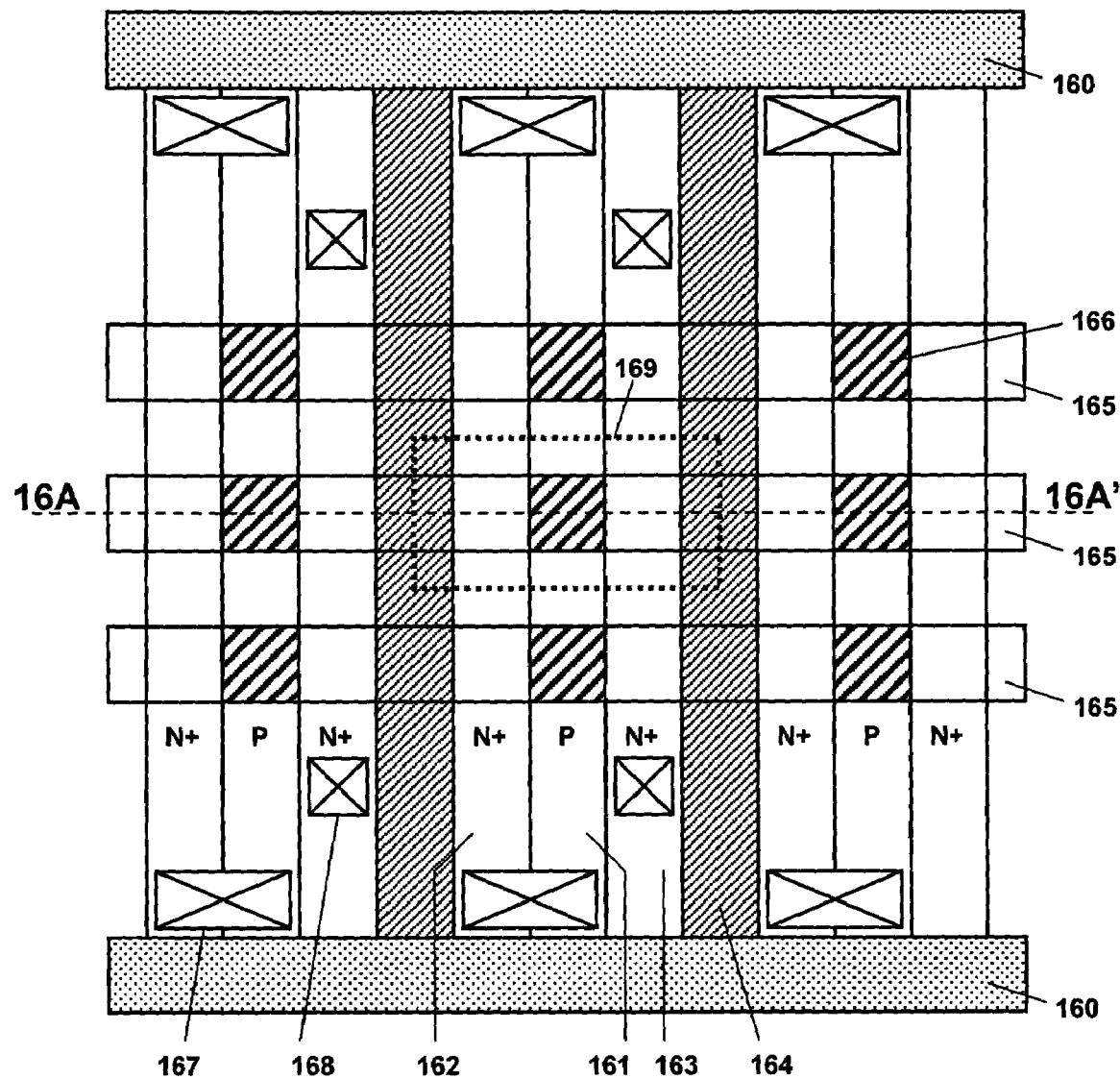
FIG. 16 is a layout plan view of the memory array portion in accordance with an embodiment of the present invention.

FIG. 16 is a layout plan view showing one embodiment of the memory array portion of the present invention. The field oxide 160 provides device isolation between the memory array block and peripheral circuits such as select gate circuits. The field oxide 160 also provides device isolation between adjacent memory array blocks. The field oxide 160 is created by the same field isolation process step, such as shallow trench isolation (STI), as in the peripheral area. The poly-1 layer 161 defines the p-type body region. The n+ source area 162 and n+ drain area 163 are created by n+ implant after patterning the poly-1 161. The n+ source area 162 and n+ drain area 163 are the local source line and local drain line, respectively, as shown in the array architectures of FIGS. 14 and 15. The field oxide 164 is self-aligned to the poly-1 layer 161. The field oxide region 164 is created by a self-aligned shallow trench isolation (SA-STI) process. The SA-STI field oxide 164 provides electrical isolation between each two adjacent columns. The poly-2 layer 165 defines the word line. The intersection of the poly-1 layer 161 and the poly-2 layer 165 defines the floating gate 166. The p-type body and n+ source 162 are connected at the butting contact 167. The drain contact 168 is contacting the n+ drain area. The unit cell 169 has a size about 8 $F^2$ (x-pitch is about 4 F and y-pitch is about 2 F), where F is the minimum geometry feature.

The "contactless" array is named because the unit cell 169 does not contain a drain or source contact. The local source line 162 connects with a global source line through the contact 167 at both ends of the array. The local drain line 163 connects with a global drain line through the contact 168 at both ends of the array. The source region 162 and drain region 163 are called buried layers because they are buried under the poly-2 word line 165. This will be clear by reviewing the final device structure in FIG. 17i. On the other hand, for a typical polysilicon gate MOSFET, both source and drain are self-aligned to the poly gate, and they are not buried under the poly gate.

In the present invention, each column has its own n+ source area 162 and n+ drain area 163, which are not shared with adjacent columns. Each two adjacent columns are electrically isolated by the field oxide 164 in between. The above unique features clearly distinguish the present invention from the U.S. Pat. Nos. 5,796,142 and 5,885,868 of the prior art, in which each two adjacent columns share the n+ source/drain region in between and there is no field oxide to electrically isolate two adjacent columns.

A nonvolatile semiconductor memory device manufacturing method of the present invention will be described by reference to FIGS. 17a-i and FIG. 18. FIGS. 17a-i schematically show the processing steps of a memory cell structure, which corresponds to three bits in a section taken along the line 16A-16A' in FIG. 16. FIG. 18 shows the process flow of fabricating the above memory cell structure. Please note FIG. 18 is not a complete process flow. FIG. 18 only contains the process steps of fabricating the memory cell array.

The starting material is a <100> oriented p-type silicon-on-insulator (SOI) wafer (step 1801). The SOI wafers can be obtained from wafer bond or SIMOX technologies. The SOI wafer shown in FIG. 17a comprises a silicon substrate 1701, a first oxide layer 1702 with a thickness of about 500 Å formed over the silicon substrate 1701, and a p-type single crystal silicon layer 1703 with a thickness of about 150 Å formed over the first oxide layer 1702. The field oxide is then formed in the peripheral regions for device isolation in a STI process (step 1802). The STI oxide is also formed in the field region 160 between memory array blocks. The STI oxide is not shown in FIG. 17a. The STI process is carried out at the very beginning of the process flow so that the thermal budget of STI process does not affect the following memory cell process.

A gate oxide layer 1704 with a thickness of about 60 to 100 Å is grown on the SOI wafer (step 1803), after which a first polysilicon layer 1705 with a thickness of about 1500 Å is deposited (step 1804). The gate oxide layer 1704 is the tunnel oxide of a memory cell device. The first polysilicon layer 1705 is then implanted with phosphorus ions with an impurity concentration of $1 \times 10^{20}$ cm$^{-3}$ or higher. An oxide buffer layer 1706 with a thickness of about 100 Å is deposited by chemical vapor deposition (CVD) (step 1805). A nitride layer 1707 with a thickness of about 500 Å is deposited (step 1806). The four composite layers (the gate oxide layer 1704, the first polysilicon layer 1705, the oxide buffer layer 1706, and the nitride layer 1707) are then patterned in a photolithographic process (step 1807) using the poly-1 layer 161 as a mask. The stripe-like poly-1 gate structures 1708 extend in the column-wise direction.

Figure 17A:
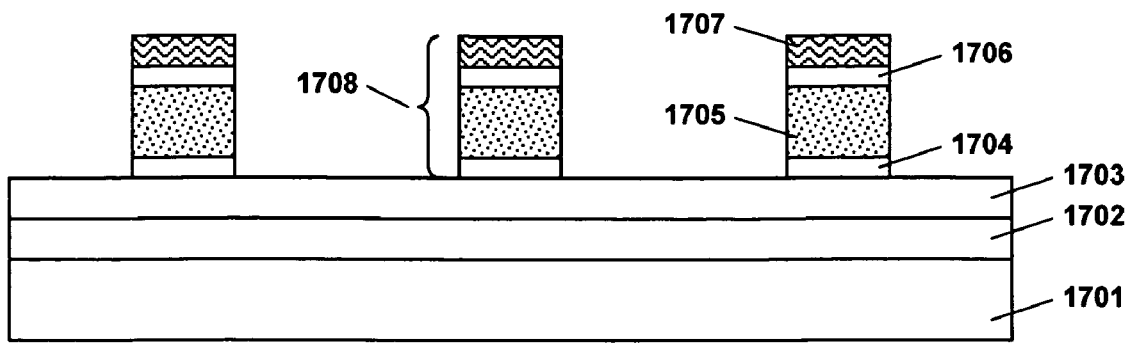
FIGS. 17a-i illustrate sectional views of the memory cell structures at different steps of the first manufacturing process of the flash memory device in accordance with the present invention.
Figure 17B:
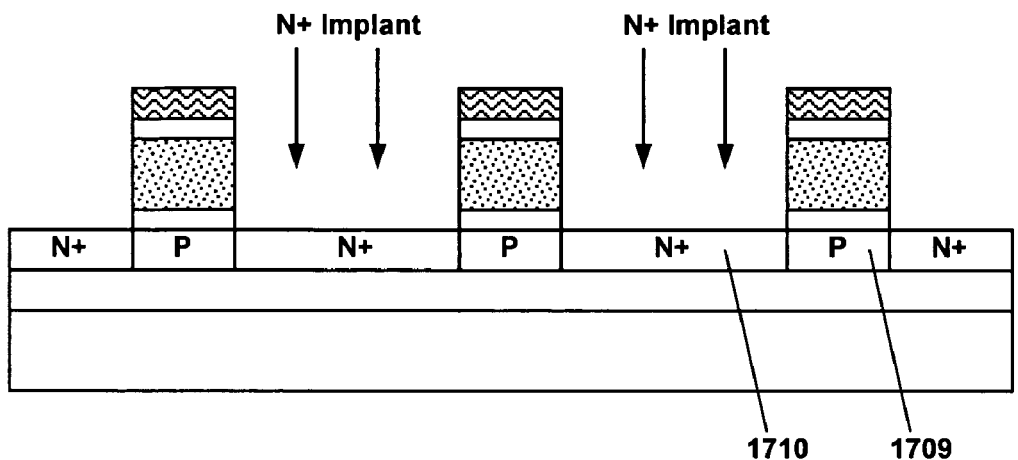
Figure 17C:
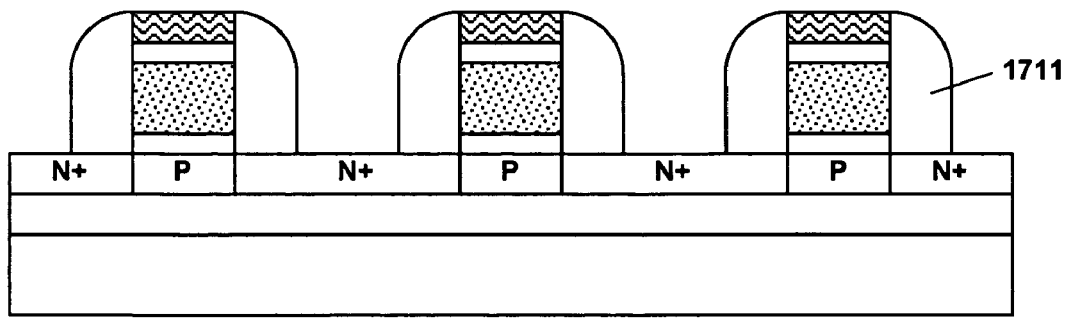
Figure 18:
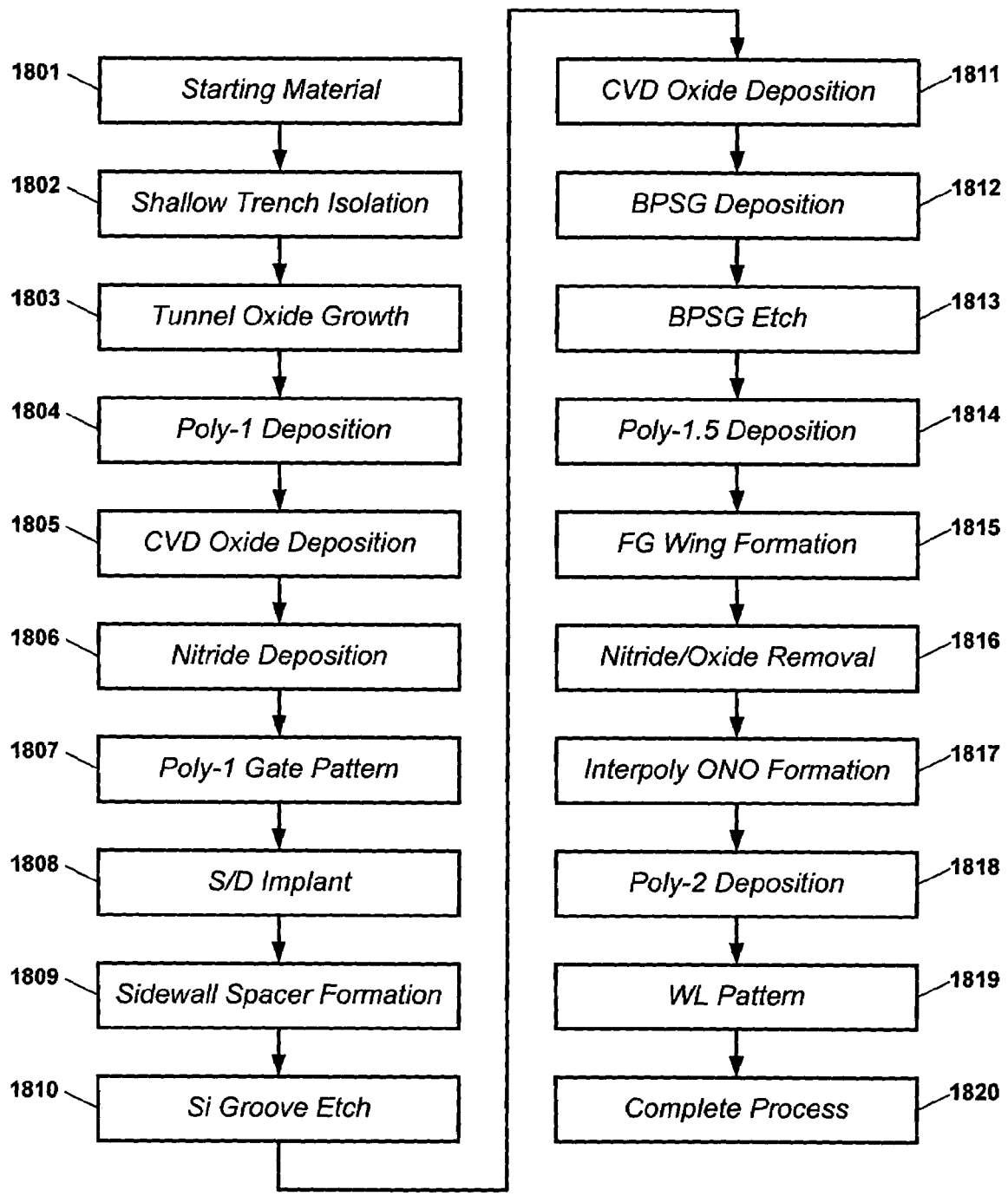
FIG. 18 shows the processing steps of fabricating the memory cell structure in FIGS. 17a-i.

The process is then followed by arsenic implantation (step 1808) at an energy level of about 20 KeV and a dose of about $2 \times 10^{15}$ cm$^{-2}$ using the poly-1 gate structure 1708 as a mask (see FIG. 17b). The arsenic implant forms the n+ source/drain regions 1710 for the memory cells. The p-type silicon area 1709 under the poly-1 gate structure does not receive the n+ implant becoming the p-type body of the memory cell transistor. Subsequently, an oxide film with a thickness of about 1500 Å is deposited, and then anisotropically etched (step 1809) to a depth equivalent to the thickness so that the deposited oxide film is formed on the side walls 1711 of the poly-1 gate structure 1708 as shown in FIG. 17c.

Figure 17D:
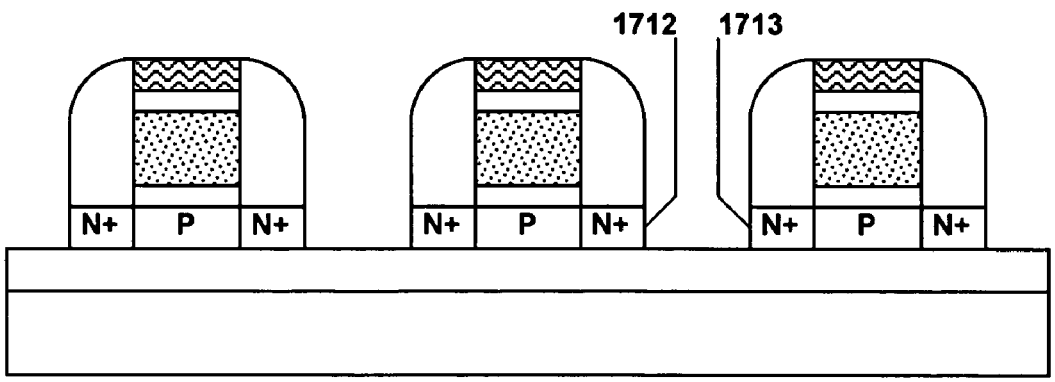

The silicon regions, which are not covered with the nitride film 1707 and the oxide spacers 1711, are removed away to form the groove regions through an anisotropic silicon etching process (step 1810) as shown in FIG. 17d. The n+ region is then divided into two electrically isolated n+ regions, which become the source and drain regions. The wafer is then wet etched in a silicon etching solution to suppress occurrence of crystal defects in the succeeding steps.

Figure 17E:
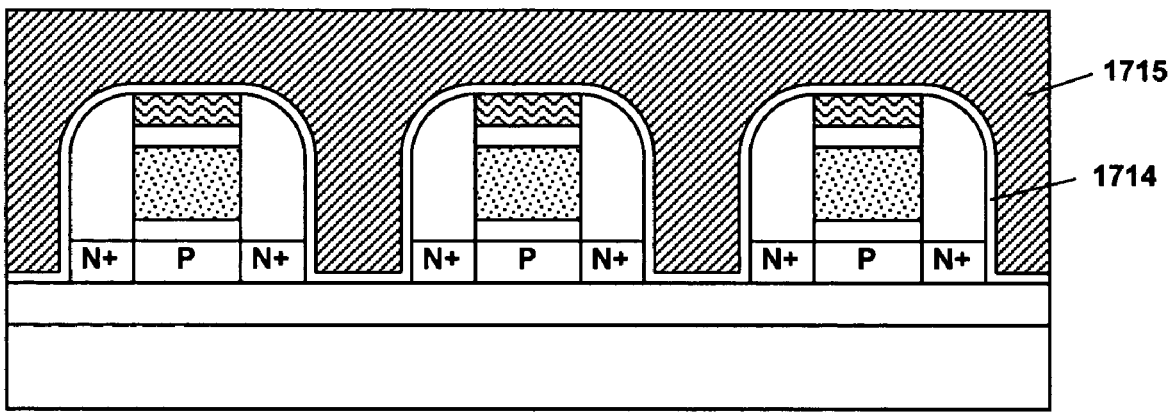
Figure 17F:
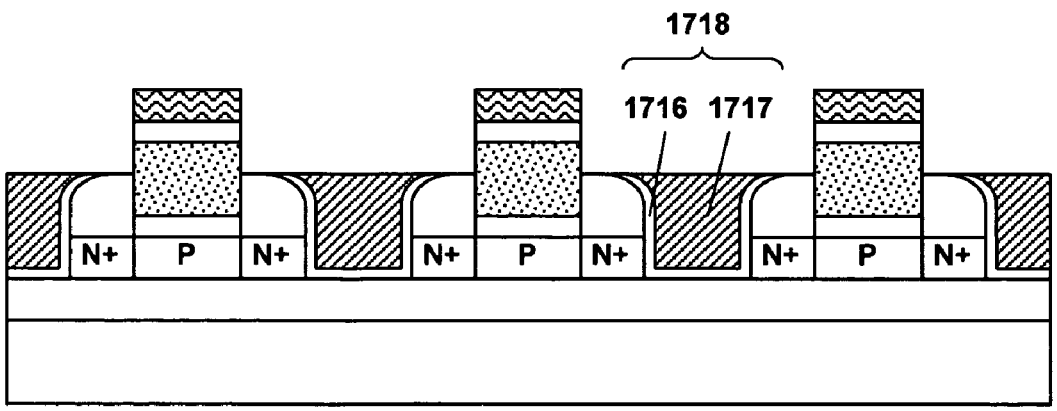

A layer of silicon dioxide 1714 with a thickness of about 100 Å is formed over the structure utilizing a conventional deposition technique (step 1811) such as low pressure chemical vapor deposition (LPCVD) or a thermal oxidation process. A boron phosphosilicate glass (BPSG) layer 1715 with a thickness of about 5000 to 8000 Å is deposited (step 1812) in a low temperature oxide (LTO) deposition procedure to cover the wafer completely. The BPSG layer 1715 is then reflown to achieve global planarity as shown in FIG. 17e. BPSG is used as a filling material because of its excellent step coverage. The diffusions of boron and phosphorus from BPSG to the active regions are controlled by the oxide layer 1714 under the BPSG layer 1715.

The BPSG layer 1715 is then etched back (step 1813) through an oxide etching process. The oxide etching process may start with a chemical mechanical polishing (CMP) process to achieve global planarization. The nitride layer 1707 is used as an etch stop layer in the CMP process. After the CMP process, the BPSG layer 1715 is then etched in either a wet or dry oxide etching process. The nitride film is exposed after the BPSG etch. In this manner, only the BPSG layer 1717 that fills the groove is left. The surface height of the BPSG layer 1717 is located approximately at the middle of the poly-1 layer 1705. The oxide sidewall spacer 1711 and the deposited oxide thin film 1714 are also etched in the oxide etching process to approximately the same height (see FIG. 17f). The self-aligned shallow trench isolation (SA-STI) 1718, consisting of the deposited oxide thin film 1716 and the BPSG layer 1717, provides the device isolation between two adjacent columns.

Figure 17G:
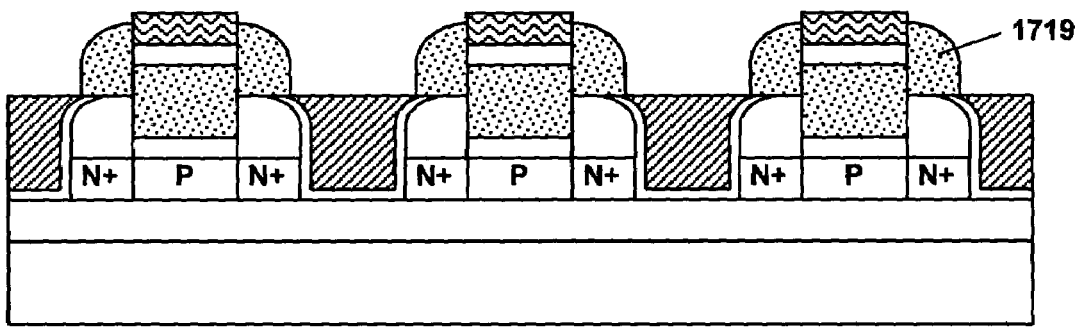

Another polysilicon layer with a thickness of about 1200 Å is deposited (step 1814). This polysilicon layer is called poly-1.5 layer. The poly-1.5 layer is implanted with phosphorus ions with impurity concentration of $1 \times 10^{20}$ cm$^{-3}$ or higher. The poly-1.5 layer is then anisotropically etched (step 1815) to a depth equivalent to the thickness so that the deposited polysilicon film is formed on the sidewalls 1719 of the poly-1 gate structure 1708 as shown in FIG. 17g. The polysilicon sidewall spacer 1719 is electrically connected with the first polysilicon 1705. The polysilicon sidewall spacer 1719 is called floating gate (FG) wing. The FG wing 1719 is to increase the surface area of the floating gate, and then increase the CG-to-FG coupling ratio. In this process, the FG wing 1719 is formed by a self-aligned polysilicon sidewall spacer process. No photo-masking step is required in this self-aligned process.

Figure 17H:
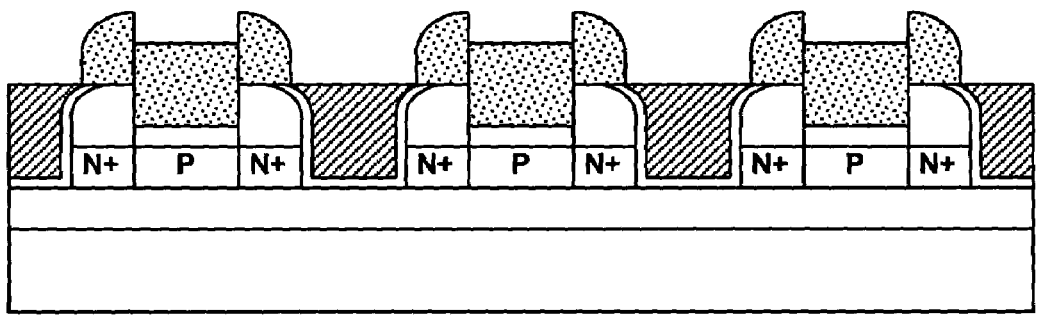
Figure 17I:
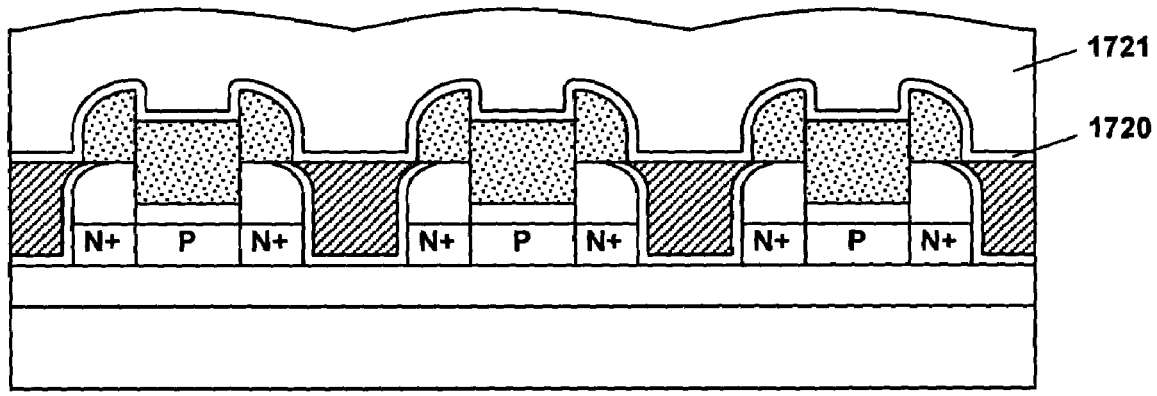

The nitride film 1707 and the oxide buffer layer 1706 are removed (step 1816) through a wet etching process as shown in FIG. 17h. Next, an oxide-nitride-oxide (ONO) layer 1720 is formed (step 1817). An ONO layer 1720 with a thickness of about 120 to 200 Å is formed by means of, for example, first reoxidizing the polysilicon layers (poly-1 layer 1705 and FG wing 1719) to form the bottom oxide layer having a thickness of about 50 to 100 Å, followed by the deposition of a nitride layer having a thickness of about 100 Å, and then reoxidizing the deposited nitride to form the top oxide layer having a thickness of about 50 to 100 Å for the ONO configuration. A second polysilicon (poly-2) layer 1721 having a thickness of about 1500 Å is then deposited (step 1818) atop the ONO film 1720 with arsenic in-situ doping achieving a dose of $1 \times 10^{20}$ cm$^{-3}$ as shown in FIG. 17i.

The poly-2 layer 1721 is then patterned in a photolithographic process (step 1819) using the WL layer 165 as a mask. Stack gates are then defined by, for example, plasma etching to remove unwanted portion of the poly-2 layer 1721, the ONO layer 1720, the FG wing 1719, and the poly-1 layer 1705. The process is then followed by a reoxidation procedure at a temperature of about 900 to 950° C. to seal the stack gate structure with an oxide layer having a thickness of 100 to 200 Å (not shown in the drawings). The sealing of the stack gate structure improves the device reliability by reducing the leakage current between floating gates and other regions.

In this demonstrated process flow as shown in FIG. 18, only two photo-masking steps are required in fabricating the memory cell devices. The first photo-masking step (step 1807) is to define the poly-1 gate structures 1708 using the poly-1 layer 161 as a mask. The poly-1 gate structures 1708 extend in the column-wise (or vertical) direction as shown in FIG. 16. The n+ source area 162 and n+ drain area 163, created by the n+ S/D implant (step 1808), are self-aligned to the poly-1 gate structure 1708. The field oxide region 164 between two adjacent columns is created by self-aligned shallow trench isolation (SA-STI) process. The field oxide 164 is self-aligned to the poly-1 gate structure 1708. All the regions (n+ source area 162, n+ drain area 163, and field oxide region 164) in a memory array run in the column-wise direction are self-aligned to the poly-1 gate structure 1708, which is defined by the poly-1 layer 161.

The second photo-masking step (step 1819) is to define the word lines and stack gates using the poly-2 WL 165 as a mask. The poly-2 word lines 165 extend in the row-wise (or horizontal) direction as shown in FIG. 16. The floating gates 166 are created in a stack gate etch (SGE) process, in which the ONO layer 1720, the FG wing 1719, and the poly-1 layer 1705 are removed in the areas where they are not covered by the poly-2. The floating gate 166 comprises of the poly-1 layer 1705 and the FG wing 1719 in the intersection area of vertical poly-1 gate structures 1708 and horizontal poly-2 word lines 165. The floating gates 166 are therefore self-aligned to the word lines.

This demonstrated memory cell process is a quadruple self-aligned process because (1) the n+ source/drain areas (162 and 163) are self-aligned to the poly-1 gate structure 1708, (2) the SA-STI field oxides 164 are self-aligned to the poly-1 gate structure 1708, (3) the FG wings 1719 are self-aligned to the poly-1 gate structures 1708, and (4) the floating gates 166 are self-aligned to the word lines 165. A self-aligned process can lower the manufacturing cost by reducing the number of photo-masking steps and minimize misalignments from a photolithographic process. A self-aligned process is therefore advantageous for high-density small-geometry flash memories.

For a conventional flash memory in bulk silicon, a high-voltage n-MOS transistor is built in a high-voltage p-well and a high-voltage p-MOS transistor is built in a deep n-well. The high-voltage p-well and deep n-well are more lightly doped and more deeply diffused than a low-voltage n-well and a low-voltage p-well, in order to provide high breakdown voltages for high-voltage transistors and memory cells. For the SOI flash memory of the present invention, the device isolation of peripheral transistors, including low-voltage and high-voltage devices, is provided by shallow trench isolation 160 and bottom oxide 1702. The high-voltage p-well and deep n-well are eliminated in the SOI process, which results in a saving of about three photo-masking steps. The high-voltage peripheral transistors on SOI are therefore designed differently to achieve high breakdown voltages.

Figure 19:
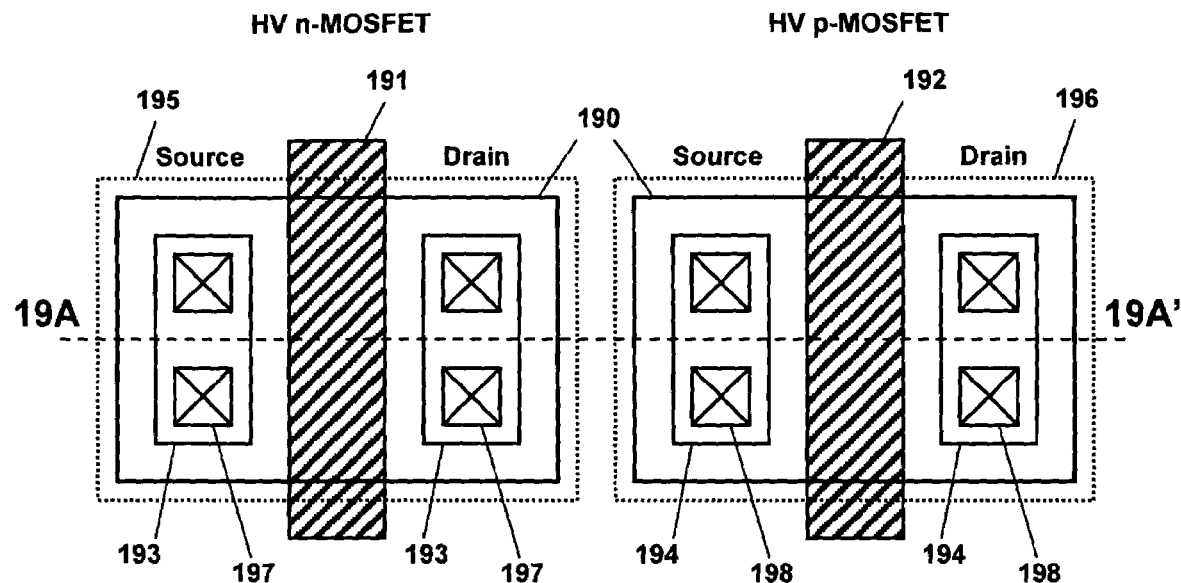
FIG. 19 is a layout plan view showing one embodiment of high-voltage n- and p-MOS transistors on SOI in accordance with the present invention.
Figure 20:
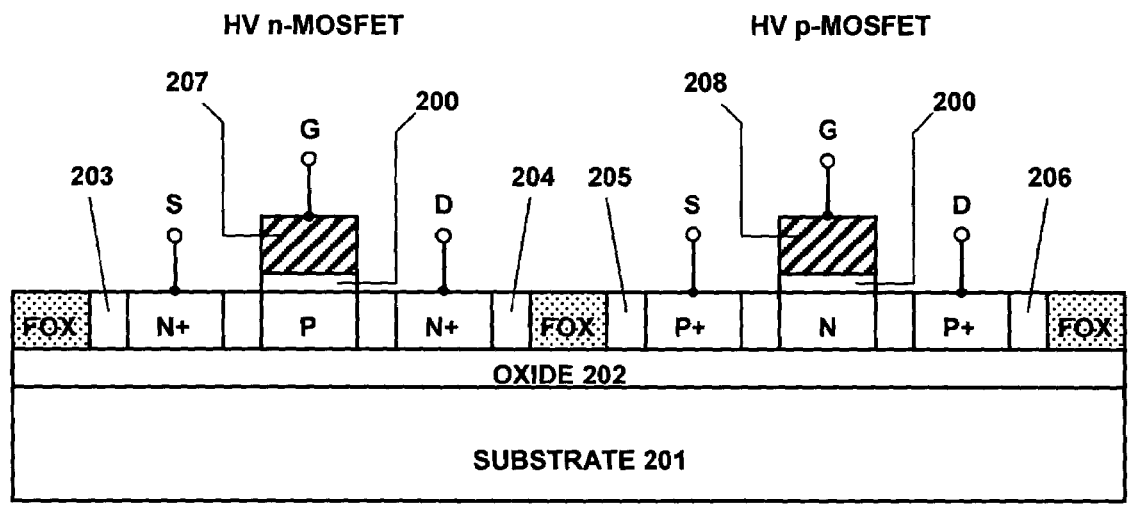
FIG. 20 is a cross-sectional view of the device structures of high-voltage n- and p-MOS transistors on SOI taken along the line 19A-19A' of FIG. 19.

FIG. 19 shows one embodiment of the schematic layout of high-voltage n- and p-MOS transistors on SOI. The HV n-MOS transistor layout consists of gate 191, active area 190, heavily doped n+ implant areas 193, lightly doped n− implant area 195, and contacts 197 to the source and drain areas. The HV p-MOS transistor layout consists of gate 192, active area 190, heavily doped p+ implant areas 194, lightly doped p− implant area 196, and contacts 197 to the source and drain areas. The cross section of the device structures of HV transistors taken along the line 19A-19A' of FIG. 19 is shown in FIG. 20. The HV MOS transistors have a thick gate oxide 200 with a thickness of about 200 Å, which is thicker than the gate oxide of low-voltage MOS transistors. The n-MOS gate 207 and p-MOS gate 208 are doped by either in-situ doping or implantation. For the HV n-MOS device, the heavily doped n+ source region is surrounded by the lightly doped n− region 203, and the heavily doped n+ drain region is surrounded by the lightly doped n− region 204. For the HV p-MOS device, the heavily doped p+ source region is surrounded by the lightly doped p− region 205, and the heavily doped p+ drain region is surrounded by the lightly doped p− region 206. The device structure of a HV transistor is primarily different from the device structure of a LV transistor by having (1) a thick gate oxide, (2) a longer channel length, (2) lightly doped (n− or p−) source/drain regions, and (3) heavily doped (n+ or p+) regions pulled back from the gate and the STI field oxide. A HV transistor has a higher junction breakdown voltage and a higher drain-to-source punchthrough voltage than a LV transistor. Although the device layouts shown in FIG. 19 are symmetric, HV devices could have asymmetric source and drain areas. For example, if the source junction does not need to sustain a high voltage, there is no need to pull back the heavily doped n+ or p+ region from the gate and STI oxide.

The tunnel oxide quality is extremely important to non-volatile memory cell performance such as data retention and endurance characteristics. For the SIMOX (Separation by Implantation of Oxygen) wafers, the oxide implantation could create lots of damages in the silicon crystal structure. Although most damages can be repaired in a following annealing process, it is still a reasonable concern that the oxide quality grown on SOI will be inferior to the oxide quality grown on bulk silicon. There was a report on the flash memory built on SOI wafers ("An Advanced Flash Memory Technology on SOI", IEDM Tech. Digest, pp. 983-986, 1998). That report has demonstrated, for the first time, the flash memory functionality on double-poly stack-gate bitcells on SOI using the same design and layout as standard bulk CMOS bitcells. The flash memories were fabricated on SIMOX substrates with single crystal silicon of a thickness of 1500 Å and buried oxide of a thickness of 4000 Å. The memory cell is programmed to a low-Vt state by FN tunneling at the drain edge. The memory cell is erased to a high-Vt state by FN tunneling in the channel region. The endurance characteristics show the tunnel oxide quality on SOI is as good as the oxide quality on bulk silicon. The SOI cells actually demonstrate less window closure than the bulk CMOS cells.

FIG. 21 illustrates another manufacturing method of the flash memory cells of the present invention. The major difference between the two manufacturing methods illustrated in FIG. 17 and FIG. 21 is the charge storage medium. The charge is stored in the poly-1 floating gate 1705 for the memory cells in FIG. 17, while the charge is stored in the localized charge trappings or nanocrystals for the memory cells in FIG. 21.

Figure 21A:
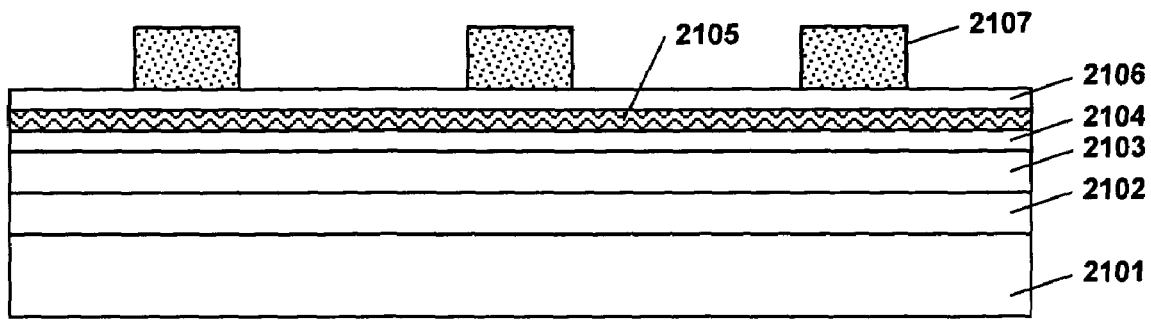
FIGS. 21a-f illustrate sectional views of the memory cell structures at different steps of the second manufacturing process of the flash memory device in accordance with the present invention.

FIGS. 21a-f schematically show the processing steps of a memory cell structure, which corresponds to three bits in a section taken along the line 16A-16A' in FIG. 16. The starting material is a p-type SOI wafer. As shown in FIG. 21a, the SOI wafer comprises a silicon substrate 2101, a first oxide layer 2102 with a thickness of about 500 Å formed over the silicon substrate 2101, and a p-type single crystal silicon layer 2103 with a thickness of about 150 Å formed over the first oxide layer 2102. A second oxide layer 2104 with a thickness of about 20 to 90 Å is grown on the SOI wafer by thermal oxidation. The second oxide layer 2104 is the tunnel oxide for carriers to tunnel through during the programming and erasing cycles. A charge storage layer 2105 made of silicon nitride, $Al_2O_3$, or AlN with a thickness of about 30 to 120 Å is deposited for localized charge trapping. For the memory cells with distributed charge storage, mutually isolated silicon or germanium nanocrystals 2105 with an average size of about 30 to 50 Å and an areal density of about $10^{11}$-$10^{13}$ cm$^{-2}$ are formed over the tunnel oxide 2104 by deposition or implantation/annealing. A third oxide layer 2106 with a thickness of about 40 to 180 Å is grown on the charge storage layer 2105 by deposition or reoxidizing the deposited nitride. The charge storage layer 2105 is embedded in between the two insulator layers 2104 and 2106. A first polysilicon layer 2107 with a thickness of about 1500 Å is deposited and patterned in a photolithographic process using the poly-1 layer 161 (in FIG. 16) as a mask. The stripe-like poly-1 gates 2107 extend in the column-wise direction.

Figure 21B:
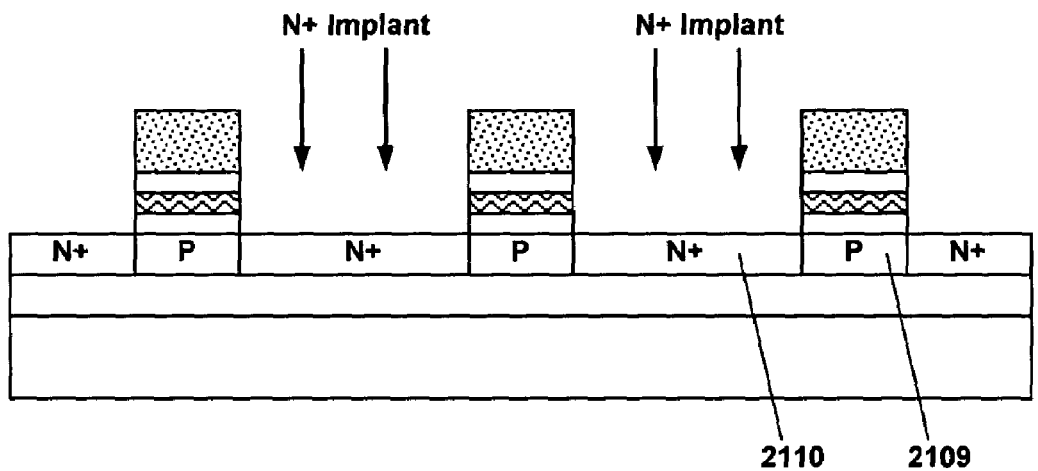

The process is then followed by arsenic implantation at an energy level of about 20 KeV and a dose of about $2 \times 10^{15}$ cm$^{-2}$ using the poly-1 gate 2107 as a mask (see FIG. 21b). The arsenic implant forms the n+ source/drain regions 2110 for the memory cells. The p-type silicon area 2109 under the poly-1 gate structure does not receive the n+ implant becoming the p-type body of the memory cell transistor. The sandwich layers (insulator/charge storage layer/insulator) 2104-

Figure 21C:
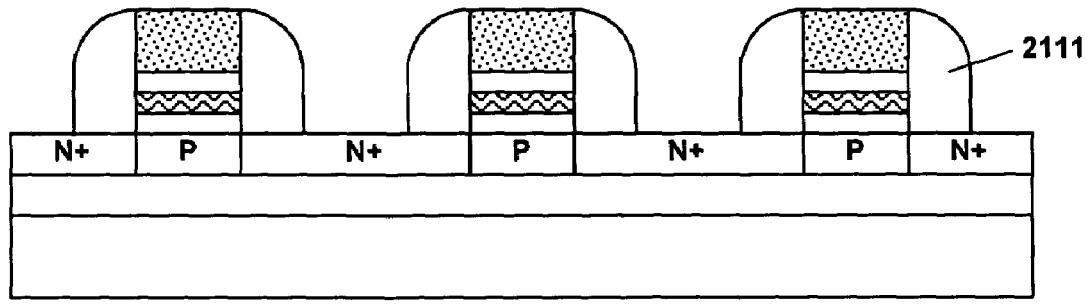

2106 not covered by the poly-1 gate 2107 are then removed in an etching process. Subsequently, an oxide film with a thickness of about 1000 Å is deposited, and then anisotropically etched to a depth equivalent to the thickness so that the deposited oxide film is formed on the side walls 2111 of the poly-1 gate 2107 as shown in FIG. 21c.

Figure 21D:
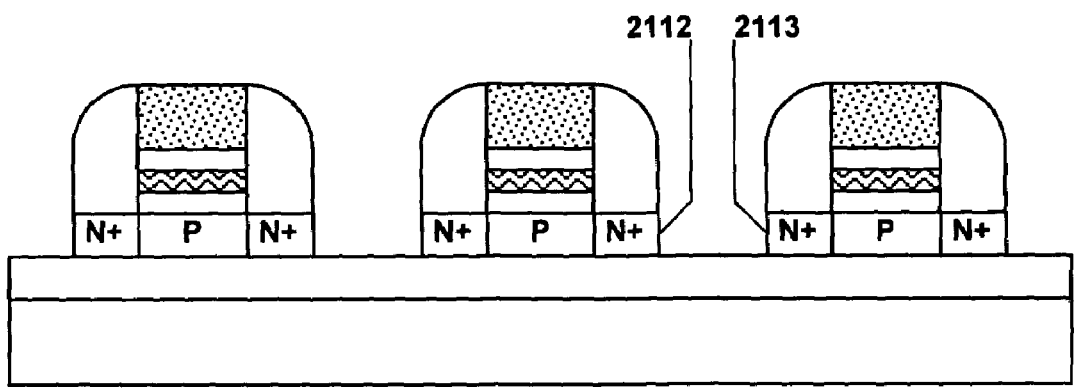
Figure 21E:
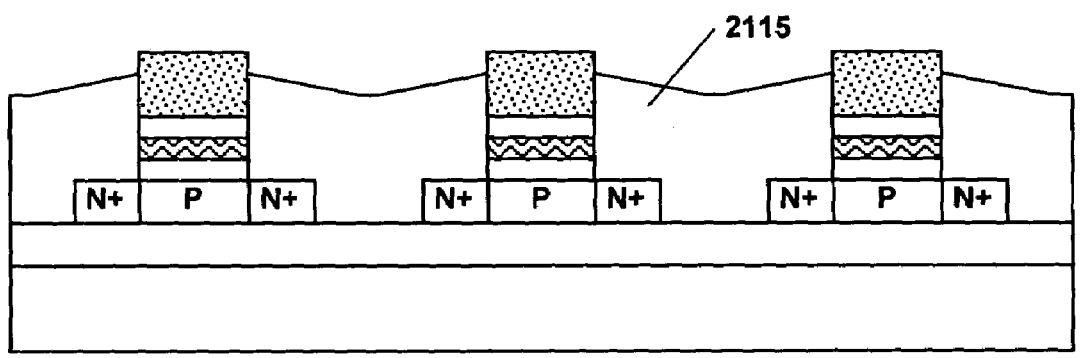

The silicon regions, which are not covered by the poly-1 gate 2107 and the oxide spacers 2111, are removed away through an anisotropic silicon etching process as shown in FIG. 21d. The n+ region is then divided into two electrically isolated n+ regions 2112-2113, which are self-aligned to the poly-1 gate 2107. The wafer is then wet etched in a silicon etching solution to suppress occurrence of crystal defects in the succeeding steps.

A layer of silicon dioxide 2115 with a thickness of about 5000 to 8000 Å is deposited by LPCVD. The oxide layer 2115 is then etched back through an oxide etching process. The oxide etching process may start with a chemical mechanical polishing (CMP) process to achieve global planarization. The poly-1 layer 2107 is used as an etch stop layer in the CMP process. After the CMP process, the oxide layer 2115 is then etched in either a wet or dry oxide etching process. The oxide layer 2115 provides the device isolation between the n+ regions of two adjacent columns. The oxide layer 2115 is self-aligned to the poly-1 gate 2107, so the oxide layer 2115 provides self-aligned shallow trench isolation (SA-STI).

Figure 21F:
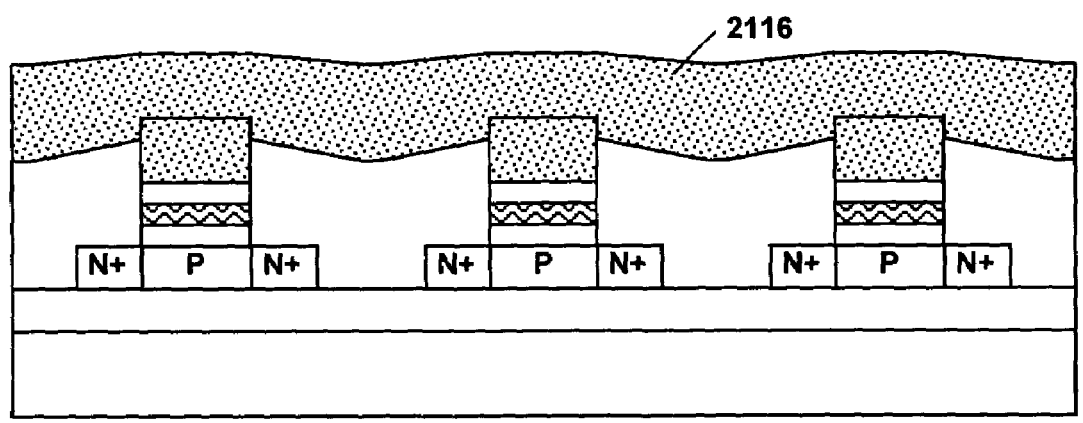

A second polysilicon (poly-2) layer 2116 having a thickness of about 1500 Å is then deposited with arsenic in-situ doping achieving a dose of $1 \times 10^{20}$ cm$^{-3}$ as shown in FIG. 21f. The poly-2 layer 2116 is electrically in contact with the poly-1 gate 2107. The poly-2 layer 2116 is then patterned in a photolithographic process using the WL layer 165 as a mask. The portion of poly-1 layer 2107, not covered by the poly-2 layer 2115, is then removed in an etching process. The remained poly-1 layer 2107 is therefore self-aligned to the poly-2 word-line 2116. The process is then followed by a reoxidation procedure at a temperature of about 900 to 950° C. to seal the stack gate structure with an oxide layer having a thickness of 100 to 200 Å (not shown in the drawings). The sealing of the stack gate structure improves the device reliability by reducing the leakage current between floating gates and other regions.

It is to be noted that the poly-1 layer 2107 can be removed before depositing the poly-2 layer 2116. In this case, the poly-1 layer 2107 functions as a dummy layer. The dummy layer provides a step height to form sidewall spacers, self-aligned n+ source/drain regions, and self-aligned STI regions. The dummy layer, therefore, can be made of a material other than polysilicon such as silicon nitride and amorphous silicon.

While the invention has been described with reference to specific embodiments, the description is illustrative of the invention and is not to be considered as limiting the invention. Various modifications and applications may occur for those skilled in the art without departing from the true spirit and scope of the invention as defined by the appended claims.

What is claimed is:

1. A method for correcting out-of-range threshold voltages of EEPROM memory cells in a semiconductor device, comprising
    specifying a tolerance range for the threshold voltage of each memory state for the EEPROM memory cells;
    detecting at least one out-of-range threshold voltage in the EEPROM memory cells;
    applying a positive voltage pulse to the gate region of the EEPROM memory cells if the detected out-of-range threshold voltage is below the specified tolerance range; and
    applying a negative voltage pulse to the gate region if the detected out-of-range threshold voltage is above the specified tolerance range.

2. The method of claim 1, wherein detecting at least one out-of-range threshold voltage comprises applying a range of voltages to the gate line and sensing the threshold voltages of the EEPROM memory cells.

3. The method of claim 1, further comprising
    applying a positive voltage pulse to a gate line if out-of-range threshold voltages are detected below the specified tolerance range at a plurality of EEPROM memory cells connected to the gate line; and
    applying a negative voltage pulse to a gate line if out-of-range threshold voltages are detected above the specified tolerance range at a plurality of EEPROM memory cells connected to the gate line.

4. The method of claim 3, further comprising
    applying two or more different voltages to different source lines wherein the different voltages correspond to different memory states of the memory cells.

5. The method of claim 3, further comprising
    applying two or more different voltages to different drain lines wherein the different voltages correspond to different memory states of the memory cells.

6. The method of claim 3, further comprising
    applying two or more different voltages to different body lines wherein the different voltages correspond to different memory states of the memory cells.

* * * * *